United States Patent
Song et al.

(10) Patent No.: US 12,506,107 B2
(45) Date of Patent: Dec. 23, 2025

(54) ELECTRONIC DEVICE AND DISPLAY DEVICE USING THE SAME

(71) Applicant: LG Display Co., Ltd., Seoul (KR)

(72) Inventors: Chang Hyun Song, Goyang-si (KR); Jae Young Oh, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 18/674,681

(22) Filed: May 24, 2024

(65) Prior Publication Data
US 2024/0312945 A1 Sep. 19, 2024

Related U.S. Application Data

(62) Division of application No. 17/334,272, filed on May 28, 2021, now Pat. No. 12,021,056.

(30) Foreign Application Priority Data

Jun. 17, 2020 (KR) .................. 10-2020-0073841

(51) Int. Cl.
*H01L 23/00* (2006.01)
*H10K 59/131* (2023.01)

(52) U.S. Cl.
CPC .............. *H01L 24/33* (2013.01); *H01L 24/08* (2013.01); *H01L 24/29* (2013.01); *H01L 24/32* (2013.01); *H01L 24/83* (2013.01); *H10K 59/131* (2023.02); *H01L 2224/08057* (2013.01); *H01L 2224/29016* (2013.01); *H01L 2224/32057* (2013.01); *H01L 2224/32227* (2013.01); *H01L 2224/32237* (2013.01); *H01L 2224/3224* (2013.01); *H01L 2224/3303* (2013.01);

(Continued)

(58) Field of Classification Search
None
See application file for complete search history.

(56) References Cited

U.S. PATENT DOCUMENTS 10,134,966 B2 * 11/2018 Fujikawa ............ H01L 25/0753
2011/0187965 A1 * 8/2011 Ooishi ................... H05K 1/028
361/749

(Continued)

FOREIGN PATENT DOCUMENTS

KR 10-2018-0125309 A 11/2018
KR 10-2020-0029683 A 3/2020
WO WO-2021092757 A1 * 5/2021 ......... H10H 20/8312

OTHER PUBLICATIONS

Kim, Hwan Tae, "Bonding Mechanism by Laser Brazing and Laser Soldering Process", Machinery Industry, Oct. 2012.

*Primary Examiner* — Nishath Yasmeen
(74) *Attorney, Agent, or Firm* — Birch, Stewart, Kolasch & Birch, LLP

(57) ABSTRACT

An electronic device can include a plurality of pad electrodes provided at at least one side of a substrate, at least one circuit film configured to have a plurality of connection electrodes provided at an insulating film to correspond to the plurality of pad electrodes, a plurality of solders to conductively connect the plurality of connection electrodes to the plurality of pad electrodes exposed from the circuit film one-to-one, and an insulating adhesive to fill spaces between the plurality of pad electrodes and the plurality of connection electrodes. Also, each of the plurality of solders has an edge horizontally protruding from the insulating film.

20 Claims, 21 Drawing Sheets

(52) U.S. Cl.
CPC ............... *H01L 2224/33055* (2013.01); *H01L 2224/33107* (2013.01); *H01L 2224/33165* (2013.01); *H01L 2224/33505* (2013.01); *H01L 2224/33517* (2013.01); *H01L 2224/83801* (2013.01); *H01L 2224/8385* (2013.01); *H01L 2224/83906* (2013.01); *H01L 2224/83939* (2013.01); *H01L 2224/83951* (2013.01)

(56) References Cited

U.S. PATENT DOCUMENTS

| | | | | |
|---|---|---|---|---|
| 2012/0195024 | A1* | 8/2012 | Kawaguchi | H05K 3/363 361/803 |
| 2016/0295706 | A1* | 10/2016 | Jiang | H05K 3/363 |
| 2018/0138260 | A1* | 5/2018 | Kajiyama | H10K 77/10 |
| 2019/0035871 | A1* | 1/2019 | Qian | H10K 77/111 |
| 2023/0095594 | A1* | 3/2023 | Li | H10H 20/857 257/79 |

* cited by examiner upper surface lower surface upper surface lower surface lower surface lower surface

ELECTRONIC DEVICE AND DISPLAY DEVICE USING THE SAME

CROSS-REFERENCE TO RELATED APPLICATIONS

This application is a Divisional of U.S. application Ser. No. 17/334,272, filed on May 28, 2021, which claims priority to Korean Patent Application No. 10-2020-0073841, filed on Jun. 17, 2020, in the Republic of Korea, the entire contents of all these applications are hereby expressly incorporated by reference as if fully set forth herein into the present application.

BACKGROUND OF THE INVENTION

Field of the Invention

The present invention relates to an electronic device, and more particularly, to an electronic device, which changes a circuit film and a corresponding structure so as to prevent a failure in a bonding process, and to a display device using the same.

Discussion of the Related Art

As our society has recently entered the information age, the field of displays for visually displaying electrical information signals has rapidly developed. As representative examples of display devices, there are a liquid crystal display (LCD), a quantum dot (QD) display, a field emission display (FED), an organic light emitting diode (OLED), etc.

A display device includes a plurality of wirings on a display panel, and is driven by receiving a signal through these wirings from the outside via a circuit unit provided at one side of the display panel. The circuit unit and a pad part of the display panel are connected by a bonding process.

When the circuit unit and the display panel are bonded using an anisotropic conductive film, a conductive material can flow during a thermos-compression process, and thereby, a conductive short-circuit between adjacent pads can occur and, in severe cases, some pads are not connected to the circuit unit and thus it can be difficult to normally transmit a signal to the display panel.

SUMMARY OF THE INVENTION

Accordingly, the present invention is directed to an electronic device, which changes a circuit film and a structure on a substrate corresponding to the circuit film so as to improve bonding reliability, and to a display device using the same that substantially obviate one or more problems due to limitations and disadvantages of the related art.

An object of the present invention is to provide an electronic device, which exposes pad electrodes from a circuit film and applies solder to the exposed regions of the pad electrodes so as to realize bonding between the pad electrodes and connection electrodes of the circuit film without thermos-compression onto the pad electrodes, and a display device using the same.

Additional advantages, objects, and features of the invention will be set forth in part in the description which follows and in part will become apparent to those having ordinary skill in the art upon examination of the following or can be learned from practice of the invention. The objectives and other advantages of the invention can be realized and attained by the structure particularly pointed out in the written description and claims hereof as well as the appended drawings.

Embodiments of the invention can address the above-mentioned limitations and other problems, and relate to an electronic device in which bonding reliability is improved by changing a circuit film and a structure on a substrate corresponding to the circuit film, and a display device using the same.

To achieve these objects and other advantages and in accordance with the purpose of the invention, as embodied and broadly described herein, an electronic device includes a plurality of pad electrodes provided at at least one side of a substrate, at least one circuit film configured to have a plurality of connection electrodes provided at an insulating film to correspond to the pad electrodes, a plurality of solders to conductively connect the connection electrodes to the pad electrodes exposed from the circuit film one-to-one, and an insulating adhesive to fill spaces between the pad electrodes and the connection electrodes, which do not come into contact with the solders, between the substrate and the circuit film.

In another aspect of the present invention, a display device includes a plurality of pad electrodes provided at at least one side of a display panel to be connected to at least one wiring provided in the display panel, at least one circuit film to have a plurality of connection electrodes provided at an insulating film so as to correspond to the pad electrodes; a plurality of solders to conductively connect the connection electrodes to the pad electrodes exposed from the circuit film one-to-one; and an insulating adhesive to fill spaces between the pad electrodes and the connection electrodes, which do not come into contact with the solder, between the substrate and the circuit film.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment (s) of the invention and together with the description serve to explain the principle of the invention. In the drawings.

DETAILED DESCRIPTION OF THE EMBODIMENTS

Figure 1:
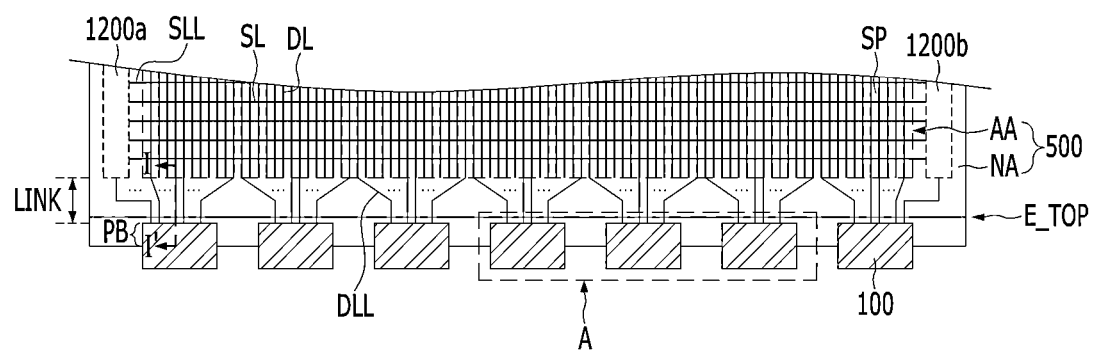
FIG. 1 is a plan view illustrating a display device according to one or more embodiments of the present invention.

Reference will now be made in detail to the exemplary embodiments of the present invention, examples of which are illustrated in the accompanying drawings. In the following description of the embodiments and the drawings, the same or similar elements are denoted by the same reference numerals throughout the specification. In the following description of the embodiments of the present invention, a detailed description of known functions and configurations incorporated herein will be omitted when it can make the subject matter of the present invention rather unclear. Further, the names of elements used in the following description of the embodiments of the present invention are selected in consideration of ease of preparation of the specification, and can thus differ from the names of parts of an actual product.

The shapes, sizes, ratios, angles and numbers of elements given in the drawings to describe the embodiments of the present invention are merely exemplary, and thus, the present invention is not limited to the illustrated details. In the following description of the embodiments, the terms "including", "comprising" and "having" are to be interpreted as indicating the presence of one or more other characteristics, numbers, steps, operations, elements or parts stated in the specification or combinations thereof, and do not exclude the presence of other characteristics, numbers, steps, operations, elements, parts or combinations thereof, or the possibility of adding the same, unless the term "only" is used. It will be understood that a singular expression of an element (s) encompasses a plural expression unless stated otherwise.

In interpretation of elements included in the various embodiments of the present invention, it is to be interpreted that the elements include error ranges unless stated otherwise.

In the following description of the embodiments, it will be understood that, when positional relationships are expressed, for example, when an element is said to be "on", "above", "under" or "beside" another element, the two elements can directly contact each other, or one or more other elements can be interposed between the two elements, unless the term "just" or "directly" is used.

In the following description of the embodiments, it will be understood that, when the terms "first", "second", etc. are used to describe various elements, these terms are used merely to distinguish the same or similar elements and may not define order. Therefore, a first element described hereinafter could be termed a second element without departing from the technical scope of the invention.

Respective features of the various embodiments of the present invention can be partially or wholly coupled to or combined with each other and be interlocked or driven in various technical manners, and the respective embodiments can be implemented independently of each other or be implemented together through connection therebetween.

Hereinafter, an electronic device and a display device using the same according to various embodiments of the present invention will be described with reference to the accompanying drawings. All components of each electronic device and each display device according to all embodiments of the present invention are operatively coupled and configured.

Figure 2:
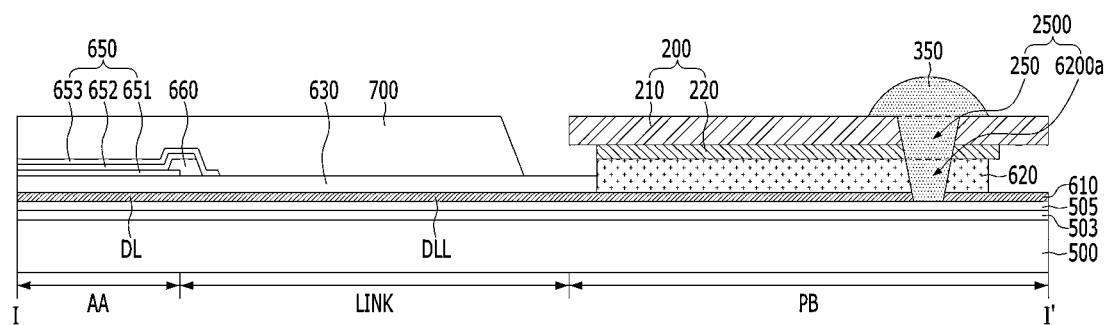
FIG. 2 is a cross-sectional view of a display device according to a first embodiment of the present invention, taken along line I-I' of FIG. 1.

FIG. 1 is a plan view illustrating a display device according to one embodiment of the present invention, and FIG. 2 is a cross-sectional view of a display device according to a first embodiment of the present invention, taken along line I-I' of FIG. 1.

As shown in FIG. 1, the display device according to one embodiment of the present invention includes a substrate 500 having an active area AA including a plurality of subpixels SP, and a non-active area NA provided outside the active area AA. The respective subpixels SP in the active area AA can be disposed in a matrix including a plurality of rows and a plurality of columns and, for example, scan lines SL are provided in a row direction, data lines DL are provided in a direction intersecting the row direction, and thus the subpixels SP are driven by receiving signals from the scan lines SL and the data lines DL. At least one thin film transistor and a storage capacitor can be provided at the intersections between the scan lines SL and the data lines DL. When the display device is a light emitting display device, the thin film transistor and/or the storage capacitor and a light emitting diode can be connected to each subpixel.

Further, when the light emitting diode is provided in each subpixel in the active area AA, an encapsulation layer 700 (in FIG. 2) or an opposite substrate can be formed so as to prevent penetration of external moisture into the light emitting diodes while protecting the light emitting diodes. A line E TOP shown in FIG. 1 indicates one side end line of the encapsulation layer 700 (in FIG. 2) or the opposite substrate, and the encapsulation layer 700 (in FIG. 2) or the opposite substrate overlaps the substrate 500 in a remainder of the substrate 500, except for a pad part PB at which circuit films 100 are connected to the substrate 500.

Further, the encapsulation layer 700 or the opposite substrate covers the subpixels SP on the substrate. The encapsulation layer 700 is a film structure formed by alternately stacking at least one pair of an inorganic film and an organic film, and covers the upper surfaces of the subpixels SP including the light emitting diodes without a vertical gap, thus being capable of protecting the subpixels SP. The opposite substrate covers the subpixels SP up to the line E-TOP shown in FIG. 1, as seen from a plane, the opposite substrate can be disposed to form a vertical gap with the subpixels on the substrate 500 or to come close to a protective film covering the surfaces of the light emitting diodes or come in contact with the protective film, and the opposite substrate can be bonded to the substrate 500 by a sealant applied to the edges of the opposite substrate and the substrate 500 into a closed loop shape. When a vertical gap is formed between the opposite substrate and the substrate 500, a space between the opposite substrate and the substrate 500 inside the sealant can be filled with a filler so as to prevent moisture penetration and to exhibit a buffering effect.

The substrate 500 and/or the opposite substrate can include an insulating material, such as glass or plastic, or in some cases, can include a metal sheet. When the substrate 500 includes a metal sheet, an insulating layer is further provided between the metal sheet and wirings formed on the substrate 500. Further, the substrate 500 can be formed of a flexible material so that the display device including the substrate 500 can be used in a flexible device.

The pad part PB including a plurality of pad electrodes is provided in a part of the non-active area NA located at at least one side of the substrate 500, and is connected to the circuit films 100 to which an electrical signal from the outside is applied.

Here, the scan lines SL and/or the data lines DL provided in the active area AA are respectively connected to the pad part PB through scan link lines SLL and data link lines DDL. The scan link lines SLL and the data link lines DDL can extend integrally from the corresponding scan lines SL and data lines DL towards the non-active area NA. Because the circuit films 100 connected to the pad part PB are provided in plural so as to be spaced apart from one another, the pad part PB is configured such that the pad electrodes are grouped so as to be disposed densely in each of regions corresponding to the circuit films 100. In this case, because the data lines DL in the active area AA have a pitch corresponding to the horizontal length of the subpixels but the pad electrodes in the pad part PB are not disposed in regions in which the circuit films 100 are spaced apart from one another, the pad electrodes are disposed relatively densely in the regions corresponding to the circuit films 100 and thus the pad electrodes have a smaller pitch than the pitch of the data lines DL. Therefore, the data link lines DLL in a link part, which extend from the data lines DL, connect the data lines DL to the pad electrodes 610 (in FIG. 2) such that the distances between adjacent data link lines DLL are gradually decreased towards the pad electrodes of the pad part PB.

The pad electrodes provided in the pad part PB are provided in a number which is greater than or equal to at least the number of the data lines DL provided in the active area. When the circuit films 100 provided in plural correspond to the substrate 500, the pad electrodes can be provided in a number which is acquired by dividing the total number of the data lines DL provided in the active area AA by the number of the circuit films 100.

FIG. 1 exemplarily illustrates that scan drivers 1200a and 1200b for driving the scan lines SL are embedded in parts of the non-active area NA of the substrate 500. The scan drivers 1200a and 1200b can be formed during a process for forming gate lines, the data lines DL and thin film transistors so as to be embedded in the substrate 500, as shown in this figure, or can be formed separately from the substrate 500 in the form of circuit films 100 provided at the lower end of the substrate 500 of FIG. 1.

When the scan drivers 1200a and 1200b are not embedded in the substrate 500 but are provided as circuit films, circuit films for driving the data lines DL and circuit films for driving scan lines SL can be disposed on the same side of the substrate 500, and in this case, pad electrodes within each of the groups can be more densely disposed. In some cases, a touch electrode array can be provided on the encapsulation layer 700, touch drivers for driving the touch electrode array can be provided on the substrate 500, and the scan drivers, the data drivers and the touch drivers can be located on one side of the substrate 500.

When the scan drivers 1200a and 1200b are provided in the substrate 500, the scan drivers 1200a and 1200b can be connected to the scan lines SL through the scan link lines SLL, and at least one wiring of the scan drivers 1200a and 1200b is connected to the circuit films 100 so that the scan drivers 1200a and 1200b can receive a timing control signal. When the scan drivers 1200a and 1200b are provided in the substrate 500, the scan drivers 1200a and 1200b can be respectively provided at both sides of the active area AA, as shown in this figure, or one scan driver can be provided only at one side of the active area AA.

The circuit film 100 is a film for transmitting a signal to the display device or the electronic device, and can include a flexible insulating film, for example, polyimide or polyamide, and a plurality of connection electrodes provided on one surface of the insulating film. In some cases, a drive integrated circuit (IC) can be provided on the other surface of the insulating film so as to be connected to the connection electrodes. In this case, connection between the drive IC and the connection electrodes can be achieved by forming at least one insulating film and at least one thin copper layer inside contact holes formed through the insulating film.

In the following description of the embodiments of the present invention, one surface of the circuit film 100 on which the connection electrodes are formed will be referred to a lower surface, and the other surface of the circuit film 100 on which no connection electrode is formed will be referred to an upper surface. The surface of the circuit film 100, on which the connection electrodes are formed, is opposite the pad electrodes directly provided on the substrate 500 in the pad part PB.

The circuit film 100 according to the present invention can be, for example, a chip on film (COF) or a flexible printed circuit board (FPCB), without being limited thereto, and can be implemented as other forms which can be connected to the pad electrodes of the display device or the electronic device. Further, the circuit film 100, which is flexible, is advantageous in that it can be bent or rolled together with the substrate 500 or independently.

First Embodiment

As shown in FIG. 2, a display device according to the first embodiment of the present invention can include a substrate 500 having pad electrodes 610, circuit films 200 disposed opposite the substrate 500 so as to have connection electrodes 220, solder 350 applied to a plurality of regions of the circuit films 200 so as to conductively connect the connection electrodes 220 to parts of the pad electrodes 610 exposed from the circuit films 200 one-to-one, and an insulating adhesive 620 configured to fill spaces between parts of the pad electrodes 610 and parts of the connection electrodes 220, which do not come into contact with the solder 350, between the substrate 500 and the circuit films 200.

As shown in FIG. 1, the pad electrodes 610 are provided in plural on at least one side of the substrate 500, the connection electrodes 220 of the circuit films 200 are also provided in plural so as to correspond to the pad electrodes 610, and the solder 350 is also applied to a plurality of regions so as to correspond to the pad electrodes 610.

The circuit film 200 includes a flexible insulating film 210 formed of an organic material as a base material, and the connection electrodes 220 formed on one surface of the insulating film 210. Although the shown example illustrates that the connection electrodes 220 are formed directly on the insulating films 210, a buffer layer formed of an inorganic film or an organic film can be further provided between the insulating film 210 and the connection electrodes 220.

In the display device according to the first embodiment of the present invention, the insulating film 210 and the connection electrodes 220 of the circuit film 200 have in common coaxial circuit film holes 250 which the solder 350 enters. Because the circuit film holes 250 have a smaller diameter than the widths of the pad electrodes 610 and the connection electrodes 220, the solder 350 entering the circuit film holes 250 is conductively connected to the side parts of the connection electrodes 220 and the side parts of the pad electrodes 610.

The solder 350 can be selectively provided in regions in which the circuit film holes 250 are provided, by laser scanning, and the circuit film hole 250 can be provided in each of the connection electrodes 220.

The solder 350 can be formed of a single metal or an alloy of a plurality of metals, for example, and can include at least one of lead (Pb), silver (Ag), copper (Cu), tin (Sn), zinc (Zn), bismuth (Bi), aluminum (Al) or indium (In). Because solder has wettability, the solder 350 in the form of a paste can fill the insides of the circuit film holes 250 during laser scanning.

Further, the insulating adhesive 620 is provided in spaces between the circuit films 200 and the substrate 500, except for the regions in which the solder 350 is applied, and thus fixes the circuit films 200 to the substrate 500. The insulating adhesive 620 is primarily applied to a region of the substrate 500 on which the pad electrodes 610 are formed, the circuit films 200 having the circuit film holes 250 are disposed on the substrate 500, and then insulating adhesive holes 6200a are formed by removing parts of the insulating adhesive 620 corresponding to the respective circuit film holes 250, thereby exposing the pad electrodes 610. The insulating adhesive 620 is left at parts of the respective pad electrodes 610, at which the circuit film holes 250 are not located, and regions between the respective pad electrodes 610, and thus the insulating adhesive 620 can fixedly adhere the circuit films 200 and the substrate 500 to each other. When the insulating adhesive holes 6200a are formed so as to correspond to the circuit film holes 250, parts of the pad electrodes 610 located under the insulating adhesive holes 6200a can be further removed in addition to the insulating adhesive 620, as shown in FIG. 2, and in some cases, only the insulating adhesive 620 can be removed so that the pad electrodes 610 can be observed through the circuit film holes 250. Even though the parts of the pad electrodes 610 corresponding to the circuit film holes 250 are removed, when the solder 350 enters the circuit film holes 250, the solder 350 is connected to the side parts of the connection electrodes 220 and the side parts of the pad electrodes 610, and thereby, conductive connection among the pad electrodes 610, the solder 350 and the connection electrodes 220 can be achieved.

Inorganic insulating films, such as a buffer layer 503 and an interlayer insulating film 505, can be further provided between the substrate 500 and the pad electrodes 610. Each of the buffer layer 503 and the interlayer insulating film 505 can include at least one layer.

The buffer layer 503 prevents impurities on the substrate 500 from affecting thin film transistors and light emitting diodes (devices) formed on the substrate 500. The interlayer insulating film 505 serves to achieve insulation between layers of scan lines SL or data lines DL, light-shielding layer lines LS or power lines VDDL and VSSL can be further provided as wirings provided in the display device in addition the scan lines SL and the data lines DL, and when the additionally provided wirings are provided in a different layer from the scan lines SL and the data lines DL, an interlayer insulating film can be further provided between the different wirings (lines).

The pad electrodes 610 can extend toward the link part LINK and the active area AA, and can thus serve as data link lines DLL and data lines DL in the respective regions. In this case, a signal applied to the pad electrodes 610 can be electrically transmitted to the data lines DL. Further, the pad electrodes 610 can be a single layer, as shown in this figure, or can be provided by additionally stacking a metal layer formed in a different layer from the data lines DL on the pad part PB.

The scan lines SL and the data lines DL can be used as metal layers, such as gate electrodes, source electrodes and drain electrodes of the thin film transistors provided in respective subpixels SP in the active area AA. Further, a passivation film and/or a protective film configured to protect the thin film transistors including the metal layers of the data lines DL and the data link lines DLL, and light emitting devices 650 conductively connected to the thin film transistors through contact holes provided in the passivation film and/or the protective film 630 are provided. The light emitting device 650 includes a first electrode 651, an emission layer 652 and a second electrode 653. The emission part of each subpixel SP can be defined as an open region. The emission layer 652 can be an organic emission layer, or, in some cases, can be an inorganic emission layer including quantum dots. The first electrode 651 can be patterned depending on the respective subpixels SP, and the second electrode 653 can be integrally formed so as to cover the entirety of the subpixels SP in the active area AA.

The light emitting devices 650 can be encapsulated by an encapsulation layer 700. The encapsulation layer 700 includes at least two inorganic encapsulation films and an organic encapsulation film between the inorganic encapsulation films. In some cases, instead of the encapsulation layer 700, an opposite substrate can be employed.

The pad electrodes 610 can have conductive connections with the scan lines SL in addition to conductive connections with the data lines DL.

The circuit film 200 is applicable not only to a display panel which displays an image, but also to various applications, such as a touch panel which performs calculation using a pen or by contact, a watch, a monitor, a mobile phone, a wearable device, a TV, a large screen used as a movie theater screen or a wall, etc., and can be provided in a form which applies signals to wirings of not only the above-described display panel but also various electronic devices. For example, when the circuit film 200 is connected to a touch panel, the touch panel can be configured such that touch electrodes are patterned on the encapsulation layer 700, and the circuit film 200 can be connected to the touch panel through link lines which are connected to the touch panel and extend to the upper portion of the substrate 500 along the side part of the encapsulation layer 700.

The display device and the electronic device according to the embodiments of the present invention have the following advantages and other benefits.

For example, at least a part of each of the pad electrodes 610 corresponding to the circuit film 200 can be exposed from the circuit film 200, and the exposed parts of the pad electrodes 610 and the connection electrodes 220 provided on the circuit film 200 can be connected by the conductive solder 350. Therefore, a thermos-compression bonding process, which is performed on pad electrodes, is omitted, compared to a method in which an anisotropic conductive film (ACF) including conductive balls is applied between a circuit film and a substrate. In the method using the anisotropic conductive film (ACF), the anisotropic conductive film (ACF) is applied to the upper surfaces of the pad electrodes across the pad electrodes, the circuit film is disposed opposite the substrate, and then, in order to vertically connect the circuit film and the pad electrodes by aligning the conductive balls of the anisotropic conductive film (ACF) with the respective pad electrodes and thermally compressing the conductive balls onto the pad electrodes, the thermos-compression process is essentially performed so that the conductive balls provided between the circuit film and the pad electrodes of upper and lower circuits are compressed and thus a conductive component flowing from the conductive balls connects the circuit film and the pad electrodes.

During such a thermos-compression process, the conductive balls of the anisotropic conductive film (ACF) agglomerate and then move, which can cause a short-circuit of adjacent pad electrodes or deviating from the pad electrodes and thus can cause a limitation in which an electrical signal is not applied to the pad electrodes due to unstable connection of the conductive balls to the pad electrodes. Further, the flexible circuit film is stretched by heat applied to the entirety of the circuit film during the thermos-compression process, and thus, misalignment between the substrate and the circuit film can occur due to a difference in thermal expansion rates therebetween and thereby causes deterioration in reliability of bonding.

On the other hand, in the electronic device and the display device according to the embodiments of the present invention, the pad electrodes 610 are exposed from the circuit film 200, and the connection electrodes of the circuit film 200 are connected to the exposed parts of the pad electrodes 610 by the solder 350 (the conductive paste) one-to-one, thereby being capable of improving reliability of bonding. For example, the display device and the electronic device according to the embodiments of the present invention omit the thermos-compression process in which heat and pressure are simultaneously applied during a bonding process, thereby being capable of preventing or minimizing a failure in conductive connection and thus improving reliability of bonding.

Further, because the circuit film holes 250 corresponding to a part of each of the connection electrodes 220 are formed in advance in the circuit film 200, and then the parts of the connection electrodes 220 of the circuit film 200 are connected to the pad electrodes 610 by inserting the conductive solder 350 into the circuit film holes 250, the solder 350 is limited to the insides of the circuit film holes 250, and thus, flow of the solder 350 towards the adjacent pad electrodes 610 can be prevented or minimized. For example, because the circuit film holes 250 are vertically formed through the circuit film 200 and the insulating adhesive 620 between the circuit film 200 and the substrate 500 is removed by laser radiation performed just after formation of the circuit film holes 250, even though the solder 350 has some properties of a liquid when it is inserted into the circuit film holes, the solder 350 has fluidity in restricted regions while filling the circuit film holes 250 formed in the vertical direction and the insulating adhesive holes 6200a formed thereunder, thereby being capable of preventing a short-circuit between adjacent pad electrodes 610. Further, when heat of the melting point of a metal component forming the solder 350 is instantaneously applied while the solder 350 is supplied, the solder 350 is hardened to a solid state almost simultaneously with supply into the circuit film holes 250, and thus, flow of the solder 350 can be effectively prevented. Here, the temperature of the applied heat is about the melting point of the solder metal, i.e., a temperature which is lower than 400° C. which is required by the method using the anisotropic conductive film (ACF), and does not change other characteristics of the solder 350 other than hardening of the solder 350 which is instantaneously performed by laser radiation.

The thickness of the applied solder 350 can be equal to or greater than the sum of the thickness of the circuit film 200 and the thickness of the insulating adhesive 620 in each connection electrode 250. In order to prevent foreign substances from being introduced into the circuit film holes 250 and to stably connect the connection electrodes 220 and the pad electrodes 610 by the solder 350, it is advantageous to supply a sufficient amount of the solder 350 to fill the volume of an overall hole 2500 formed by the circuit film hole 250 and the insulating adhesive hole 6200a.

Particularly, when the circuit film 200 having the holes 2500 or a removal part according to the present invention is provided, in a high resolution display having a fine-pitch structure in which a pitch between pads is small, a short-circuit between adjacent pads can be prevented, and reliability of bonding between connection electrodes of a circuit film and pad electrodes of a substrate can be improved.

Region A including the pad part PB shown in FIG. 1 will be enlarged and described in the following embodiments.

Second Embodiment

Figure 3:
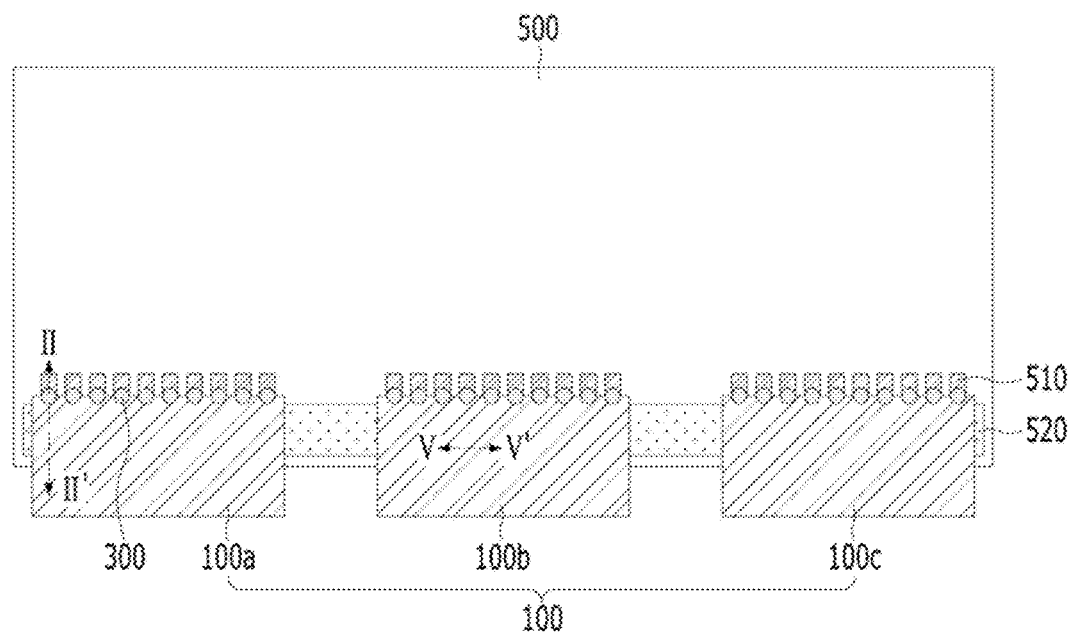
FIG. 3 is a plan view illustrating a display device or an electronic device according to a second embodiment of the present invention.
Figure 4:
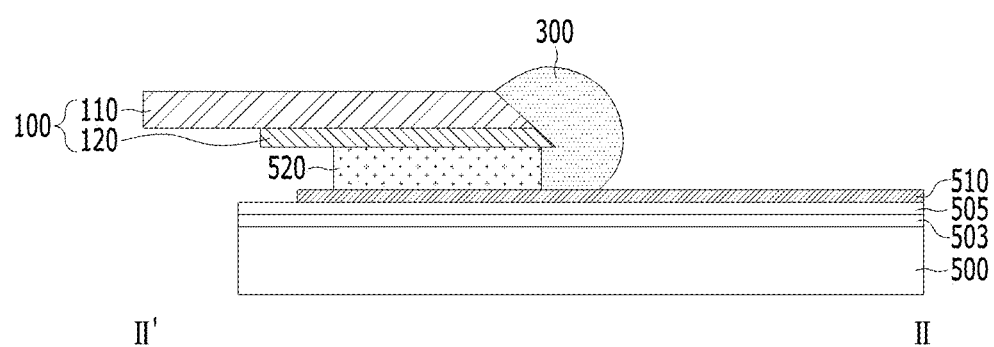
FIG. 4 is a cross-sectional view taken along line II-II' of FIG. 3.
Figure 5:
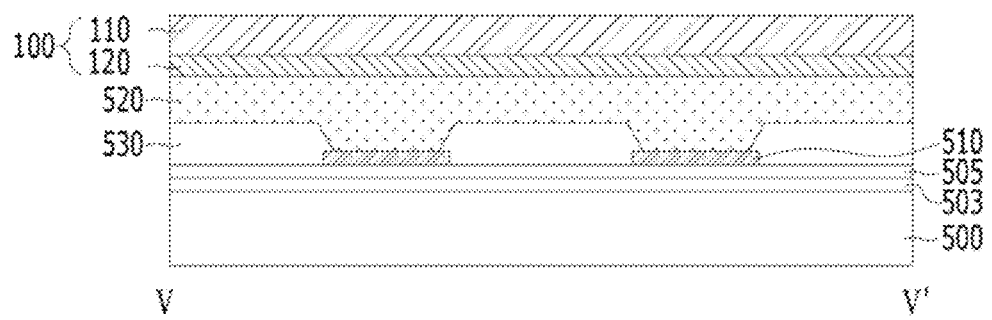
FIG. 5 is a cross-sectional view taken along line V-V' of FIG. 3.

FIG. 3 is a plan view illustrating a display device or an electronic device according to a second embodiment of the present invention, FIG. 4 is a cross-sectional view taken along line II-II' of FIG. 3, and FIG. 5 is a cross-sectional view taken along line V-V' of FIG. 3.

As shown in FIGS. 3 to 5, the display device or the electronic device according to the second embodiment of the present invention can include a plurality of pad electrodes 510 provided on at least one side of a substrate 500, circuit films 1000: 100a, 100b and 100c disposed opposite the substrate 500 and including a plurality connection electrodes 120 on an insulating film 110, solder 300 applied to a plurality of regions of the circuit films 100 so as to conductively connect the connection electrodes 120 to parts of the pad electrodes 510 exposed from the circuit films 100 one-to-one, and an insulating adhesive 520 configured to fill spaces between the pad electrodes 510 and the connection electrodes 120, which do come into contact with the solder 300, between the substrate 500 and the circuit films 100.

The display device according to the second embodiment has a different configuration from that of the display device according to the first embodiment in that the solder 300 is applied to be connected to parts of the pad electrodes 510 exposed from the edges of the circuit films 100 rather than from the middles of the circuit films. In this case, the solder 300 can be applied to each of the pad electrodes 510, and can thus connect the upper surfaces of the pad electrodes 510 and the side parts of the connection electrodes 120 one-to-one. Further, when the insulating adhesive 520 is applied to a farther inward position than the edge of the circuit film 100, not only the side parts of the connection electrodes 120 but also parts of the lower surfaces of the connection electrodes 120 are connected solder 300, thereby being capable of lengthening conductive paths.

Further, when the edge of the insulating film 110 is cut so as to be inclined at an acute angle from the surface of the insulating film 110, as shown in FIG. 4, the angle of the insulating film 100 forms entrance paths of the solder 300 in the form of a paste and can thus improve connectivity between the connection electrodes 120 and the pad electrodes 510. Further, such an angle can be formed using a cutting machine, and the removal part of the circuit film 100 formed by cutting can have a semicircular shape from the edge of the circuit film 100 to each connection electrode 120 on the surface of the circuit film 100, as shown in FIG. 3. In this case, three-dimensionally, the removal part of the circuit film 100 can have a shape acquired by vertically dividing a cone. The two-dimensional shape of the removal part of the circuit film 100 can be a semicircular shape, as shown in this figure, or can be a semielliptical shape or a polygonal shape. When the removal part of the circuit film 100 has a curved shape, such as a semicircular shape or a semielliptical shape, or a polygonal shape having more sides, the contact efficiency of a solder material having wettability can be improved.

As shown in FIG. 4, the connection electrodes 120 can be also cut to have the same angle as the insulating film 110. In this case, a connection area between the conductive solder 300 and the connection electrode 120 can be increased due to the connection electrode 120.

In the second embodiment, the thickness of the solder 300 hardened after application can be equal to or greater than the sum of the thickness of the circuit film 100 and the thickness of the insulating adhesive 520 in each connection electrode 250, in the same manner as in the first embodiment. The reason for this is to enable the solder 300 to be connected to the pad electrode 510 provided under the insulating adhesive 520 along the side surface of the circuit film 100.

As shown in FIG. 5, which is a cross-sectional view of the substrate 500 between adjacent pad electrodes 510, a protective film 530 is provided to cover regions between the pad electrodes 510 and the edges of the respective pad electrodes 510. The protective film 530 can be formed in the same layer as the passivation film and/or the protective film 630 of FIG. 2, can include an organic insulating film, and can function to electrically isolate the adjacent pad electrodes 510 from each other and to protect the pad electrodes 510. The protective film 530 is selectively patterned at a pad part PB so as to expose a part of the upper surface of each of the pad electrodes 510.

The protective film 530 includes an organic insulating film having a thickness, which is equal to or greater than the thickness of the pad electrodes 510, so as to protect the pad electrodes 510. When the circuit film 100 is adhered to the surface of the substrate 500 by aligning the connection electrodes 120 with the pad electrodes 510, the insulating adhesive 520 interposed between the circuit film 100 and the substrate 500 is applied in the state in which a part of each of the pad electrodes 510, which are filled with the solder 300, is exposed, and thus, does not influence conductive connection between the connection electrodes 120 and the pad electrodes 510 using the solder 300.

Further, the insulating adhesive 520 includes at least one of epoxy resins, acrylic resins, or polyurethane resins, and a cross-linker and/or additives. The insulating adhesive 520 has insulating properties and adhesive properties, and does not electrically influence the remaining elements provided on the substrate 500 even though the insulating adhesive 520 remains in the regions to which it is applied. Further, the circuit films 100 can be adhered to the substrate 500 by the insulating adhesive 520 under a pressure applied when the circuit films 100 are aligned with the substrate 500. In this case, the thermos-compression process can be omitted, compared to the method using the anisotropic conductive film (ACF) in which pressure and heat enough to break the conductive balls in the anisotropic conductive film (ACF) are applied. Further, in the display device according to the present invention, the insulating adhesive 520 is applied in a direction intersecting the lengthwise direction of the pad electrodes 510 on the substrate 50, as shown in FIG. 3, and can be applied one time in one direction of the substrate 500 for the purpose of process convenience. In some cases, the insulating adhesive 520 may not be applied to regions in which the circuit films 100 are not disposed.

The buffer layer 503 and the interlayer insulating film 505 formed of inorganic insulating film components provided between the substrate 500 and the pad electrodes 510 have been described above.

Further, link lines or the active area are omitted in FIG. 3, the pad electrodes 510 can extend to be formed integrally with the link lines and lines in the active area, as shown in FIG. 1, and signals can be applied to the lines in the active area through the pad electrodes 510 and the link lines.

In the display device according to the second embodiment of the present invention, signals can be applied to scan lines and data lines, provided in the active area so as to drive the display device, through the circuit films 100. Further, the second embodiment of the present invention shown in FIGS. 3 to 5 can be applied not only to a display device which displays information and/or images in the active area thereof but also to an electronic device which includes separate wirings in the active area thereof and has a pad part provided at one side of a substrate so as to receive drive signals for the wirings. In this case, when the second embodiment of the present invention is applied to an electronic device or a display device, if pad electrodes are disposed densely with a fine pitch, removal parts of circuit films corresponding to connection electrodes and the pad electrodes can be formed by laser scanning in which a region is set to a fine spot, and solder can be supplied to the circuit films. Particularly, when not only a pad part for drivers but also drivers for touch-screens are provided on a substrate, such as a display panel, even though the pitch between the pad electrodes is more narrowed, holes or a removal part can be set to have a size corresponding to a fine spot size, and thus the circuit films and the substrate can be connected without a failure. Therefore, the second embodiment of the present invention is easily applied to a high-resolution display or electronic device.

The display device or the electronic device according to the second embodiment of the present invention exposes at least a part of each of the pad electrodes 510 corresponding to the circuit films 100 from the circuit films 100, thereby being capable of connecting the exposed parts of the pad electrodes 510 and the side parts of the connection electrodes 120 provided on the circuit film 100 through the solder 300. Therefore, in the display device or the electronic device according to the second embodiment of the present invention, the thermos-compression process performed on the pad electrodes 510 can be omitted, compared to the method in which using the anisotropic conductive film (ACF) including conductive balls is applied to a circuit film and a substrate. In the method using the anisotropic conductive film (ACF), the anisotropic conductive film (ACF) is applied to the upper surfaces of the pad electrodes across the pad electrodes, the circuit film is disposed opposite the substrate, and then, in order to vertically connect the circuit film and the pad electrodes by aligning the conductive balls of the anisotropic conductive film (ACF) with the respective pad electrodes and compressing the conductive balls onto the pad electrodes so as to vertically connect the circuit film and the pad electrode, the thermos-compression process is essentially performed. However, during such a thermos-compression process, the conductive balls of the anisotropic conductive film (ACF) agglomerate and then move, thereby causing a short-circuit of adjacent pad electrodes or deviating from the pad electrodes and thus causing a problem in which an electrical signal is not applied to the pad electrode due to unstable connection of the conductive balls to the pad electrodes. On the other hand, in the electronic device and the display device according to the present invention, the pad electrodes 510 are exposed from the circuit film 100, and the connection electrodes 120 of the circuit film 100 are connected to the exposed parts of the pad electrodes 510 by the solder 300 (the conductive paste) one-to-one, thereby being capable of improving reliability of bonding. For example, the display device and the electronic device according to the present invention omit the thermos-compression process in which heat and pressure are simultaneously applied during a bonding process, thereby being capable of preventing a failure in conductive connection and thus improving reliability of bonding.

Further, in the display device or the electronic device according to the second embodiment of the present invention, a removal part is formed by cutting one side (edge) of the circuit film 100 corresponding to a part of each of the connection electrodes 120, and the side part of the connection electrode 120 of the circuit film 100 and the corresponding pad electrode 510 are connected by inserting the conductive solder 300 into the removal part. Because flow of the solder 300 is guided along the shape of the removal part, flow of the solder 300 to the adjacent pad electrode 510 can be prevented. Therefore, occurrence of a short-circuit between adjacent pad electrodes 510 due to flow of the solder 300 can be prevented. Further, because heat of greater than or equal to the melting point of a metal component forming the solder 300 is instantaneously applied while the solder 300 supplied, the solder 300 is hardened to a solid state almost simultaneously with supply into the removal part of the circuit films 100, and thus, flow of the solder 300 can be effectively prevented.

In some cases, according to a modified example of the second embodiment of the present invention, holes or a removal part is not formed in the circuit films 100, as shown in FIG. 3, but the exposed parts of the pad electrodes 510 and the connection electrodes 120 located at the side parts of the circuit films 100 can be connected by applying the solder 300 directly to the side parts of the circuit films 100 in FIG. 3. In this case, the connection electrodes 120 extend to be located at the edges of the circuit films 100 and, when the solder 300 is applied to the side parts of the circuit films 100, the solder 300 can be directly connected to the side parts of the connection electrodes 120 of the circuit films 100. In this case, process simplification can be realized.

Third Embodiment

Figure 6:
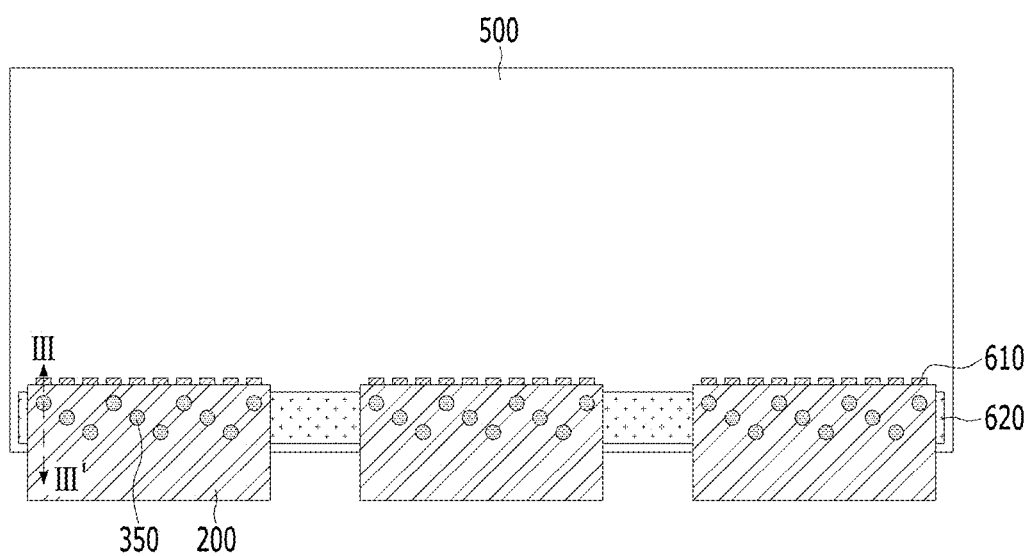
FIG. 6 is a plan view illustrating a display device or an electronic device according to a third embodiment of the present invention.
Figure 7:
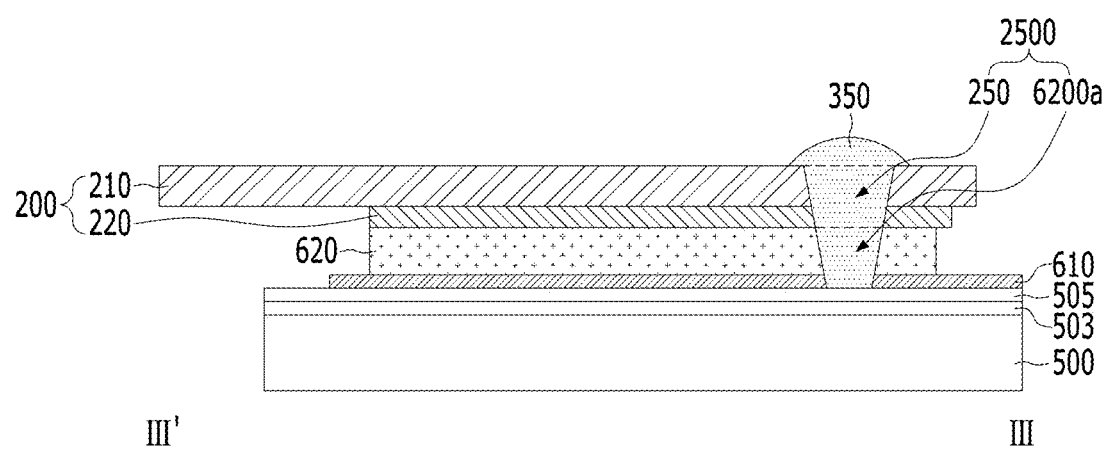
FIG. 7 is a cross-sectional view taken along line III-III' of FIG. 6.

FIG. 6 is a plan view illustrating a display device or an electronic device according to a third embodiment of the present invention, and FIG. 7 is a cross-sectional view taken along line III-III' of FIG. 6.

As shown in FIGS. 6 and 7, the display device or the electronic device according to the third embodiment of the present invention includes circuit film holes 250 formed through circuit films 200 and insulating adhesive holes 6200a formed through an insulating adhesive 620 so as to be vertically connected to the circuit film holes 250, as seen from the cross-sectional view, in the same manner as the display device or the electronic device according to the first embodiment.

In the display device or the electronic device according to the third embodiment, the circuit film holes 250 can be provided in a plurality of rows in each of the insulating films 200, the circuit film holes 250 in one row can be arranged every n connection electrodes 200 and every n pad electrodes 610 (n being a natural number equal to or greater than 2), and the circuit film holes 250 in adjacent rows can be located in different columns. Although the example shown in FIG. 6 illustrates that the circuit film holes 250 are distributed into three rows such that the circuit film holes 250 in one row are arranged every three pad electrodes and every three connection electrodes 220, the circuit film holes 250 are not limited to these numbers, and the circuit film holes 250 can be arranged in different numbers as long as the circuit film holes 250 are regularly arranged in a plurality of rows. Here, the circuit film holes 250 are filled with the solder 350 by laser scanning and, in this case, the circuit film holes 250 in the first row are formed and thereafter are sequentially scanned using a laser beam when the circuit film holes 250 in the second row are formed. In this case, a margin in laser scanning is increased by the number of the circuit film holes 250 in one row in the circuit films 200, and thus, this structure is easily applied to a pad structure having a fine pitch.

In the display device or the electronic device according to the third embodiment, the circuit film holes 250 and the solder 350 in the consecutive rows are arranged in a diagonal direction.

In the third embodiment, the insulating film 210 and the connection electrodes 220 of the circuit film 200 can have in common the coaxial circuit film holes 250 which the solder 350 enters, and the insulating adhesive 620 can have the insulating adhesive holes 6200a connected to the circuit film holes 250. Because the circuit film 200 and the insulating adhesive 620 have the circuit film holes 250 and the insulating adhesive holes 6200a, which are coaxially formed, the connection electrodes 220 and the pad electrodes 610 can be conductively connected one-to-one, and thus, interference of the solder 350 between adjacent pad electrodes 610 can be prevented.

As shown in FIG. 7, the pad electrodes 610 can respectively have a pad electrode hole connected to the insulating adhesive hole 6200a (formed by removing a part of the pad electrode 6100 under the insulating adhesive hole 6200a), and the solder 350 can be connected to the pad electrode 610 through the inner surface of the pad electrode hole. Here, the pad electrode hole corresponding to the insulating adhesive hole 6200a can be formed in the pad electrode 610, or may not be formed in the pad electrode 610. When the pad electrode hole is formed in the pad electrode 610, the solder 350 can enter the pad electrode 610, and thus, flow of the solder 350 can be limited and the pad electrode 610 and the corresponding connection electrode 220 can be more precisely connected by the solder 350.

Hereinafter, methods for manufacturing display devices or electronic devices according to embodiments of the present invention will be described.

FIGS. 8A to 8F are plan views illustrating a process for manufacturing the display device or the electronic device according to the third embodiment of the present invention, and FIGS. 9A to 9D are cross-sectional views illustrating the process for manufacturing the display device or the electronic device according to the third embodiment of the present invention.

Figure 8A:
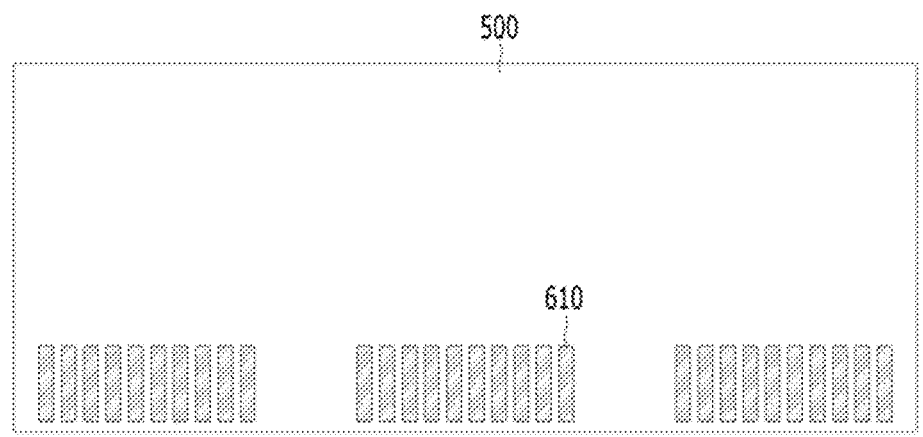
FIGS. 8A to 8F are plan views illustrating a process for manufacturing the display device or the electronic device according to the third embodiment of the present invention.

First, as shown in FIG. 8A, a plurality of pad electrodes 610 is prepared on one side of the substrate 500. The pad electrodes 610 are grouped so as to be disposed densely in each of regions corresponding to the respective circuit films 100. Although the shown example illustrates the pad electrodes 610 alone, the pad electrodes 610 have conductive connections to wirings, such as data lines or scan lines, provided in an inner area of the substrate 500. Further, the encapsulation layer 700 (in FIG. 2) is formed on the substrate 500, except for the pad electrodes 610, thereby being capable of protecting the subpixels including the light emitting devices 650 (in FIG. 2) and the thin film transistors formed in the active area AA.

Figure 8B:
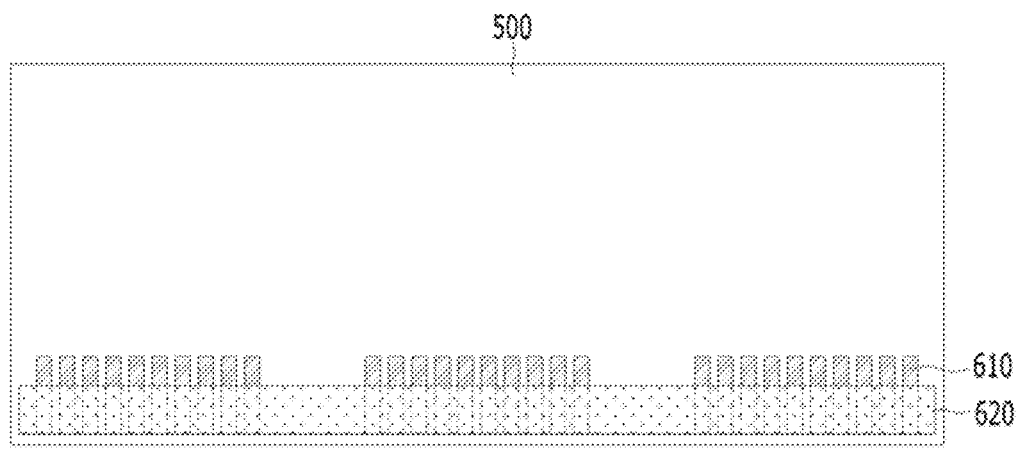

As shown in FIG. 8B, the insulating adhesive 620 is applied in a direction crossing the lengthwise direction of the pad electrodes 610. The insulating adhesive 620 includes at least one of epoxy resins, acrylic resins, or polyurethane resins, and a cross-linker and/or additives.

Figure 8C:
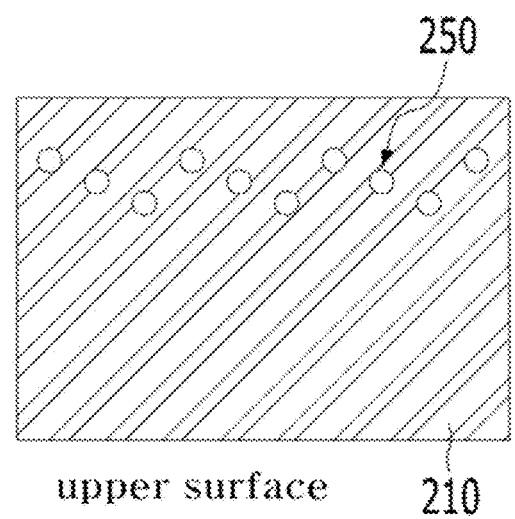
Figure 8C:
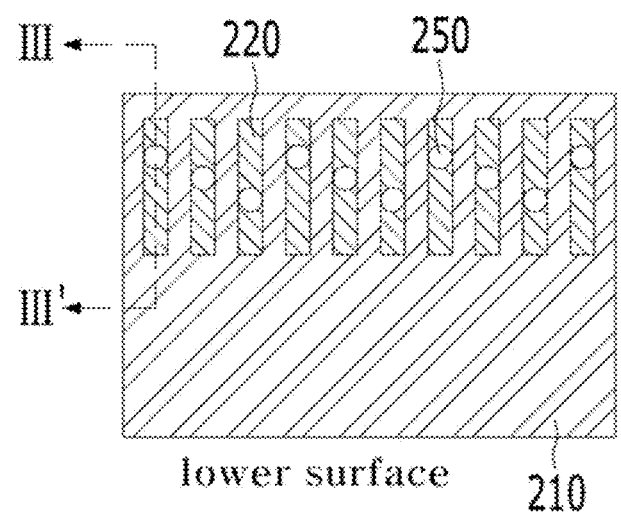
Figure 9A:
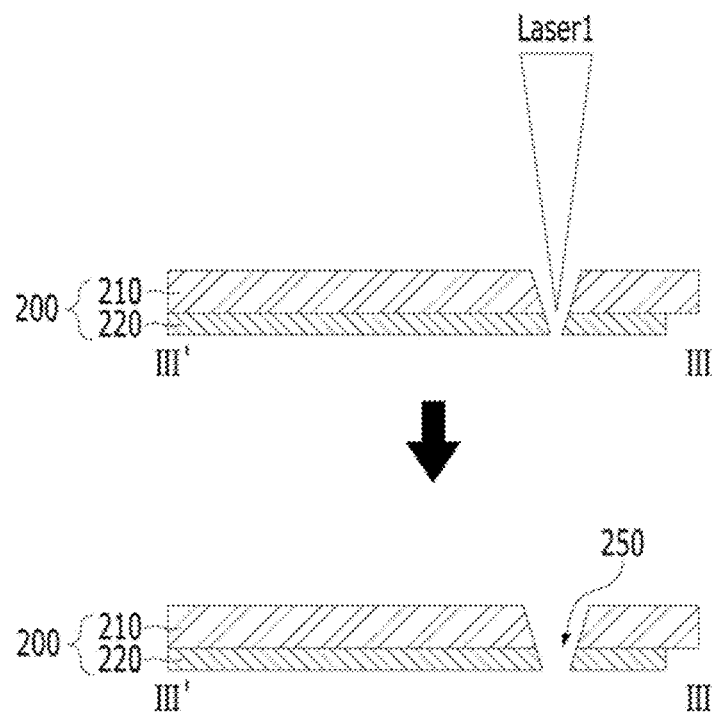
FIGS. 9A to 9D are cross-sectional views illustrating the process for manufacturing the display device or the electronic device according to the third embodiment of the present invention.

As shown in FIGS. 8C and 9A, the circuit film 200 includes the insulating film 210 and a plurality of connection electrodes 220 provided on the lower surface of the insulating film 210. The circuit film holes 250 are formed by primarily radiating a laser beam onto the circuit films 200 such that the circuit film holes 250 formed in adjacent connection electrodes 220 are arranged in different rows so as not to be adjacent to each other, as shown in FIG. 9A.

In FIG. 8C, the upper surface of the circuit film 200 is one surface of the circuit film 200 which is observed when the substrate 500 having the elements provided in the active area is seen from above, and the lower surface of the circuit film 200 is the other surface of the circuit film 200 opposite the pad electrodes 610.

The circuit film holes 250 are vertically formed through the insulating film 210 and the connection electrodes 220 of the circuit film 200, and can thus be observed on both the upper and lower surfaces of the circuit film 200.

Figure 8D:
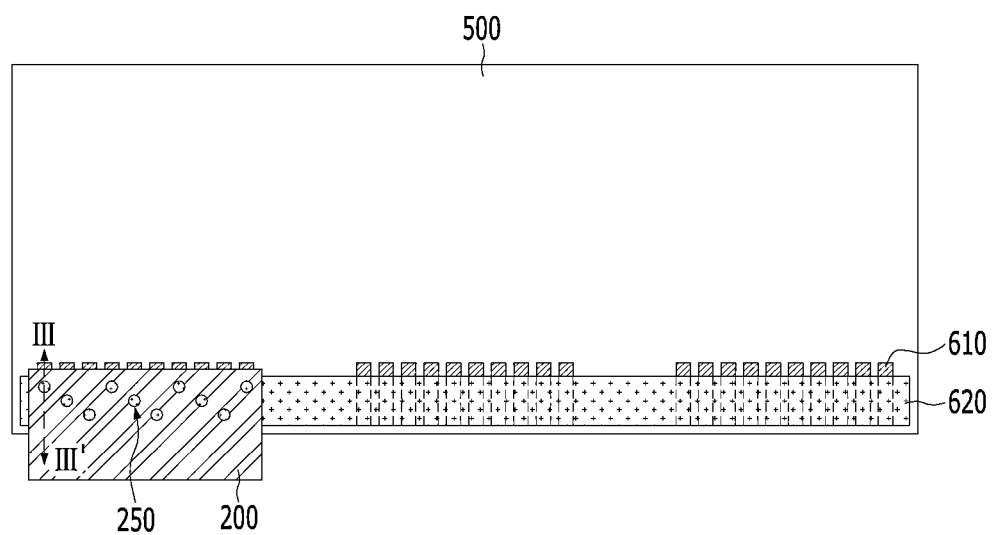
Figure 9B:
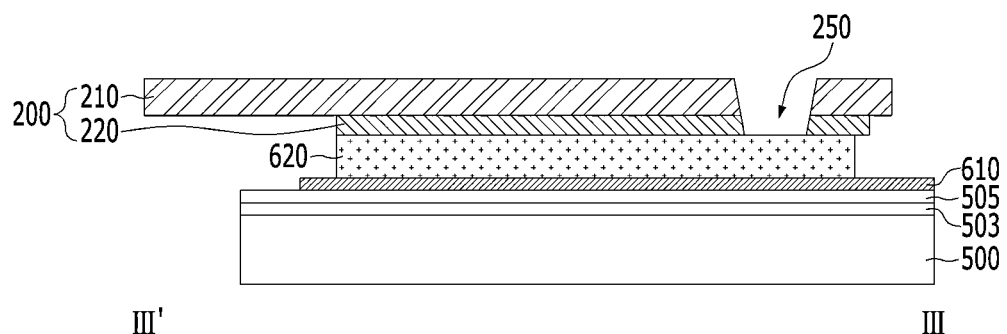

The circuit film holes 250 are formed so as to correspond to the respective connection electrodes 200, and the circuit film 200 having the circuit film holes 250 corresponding to the connection electrodes 220 one-to-one is disposed opposite the upper surface of the substrate 500 to which the insulating adhesive layer 620 is applied, as shown in FIGS. 8D and 9B. When the circuit film 200 is aligned with the upper surface of the substrate 500, a part of each of the pad electrodes 610 is exposed from the circuit film 200, and thereby, alignment between the pad electrodes 610 and the respective connection electrodes 220 of the circuit film 200 can be easily performed. Here, as shown in FIG. 9B, the insulating adhesive 620 is observed through the circuit film holes 250 formed in the circuit film 200.

Figure 8E:
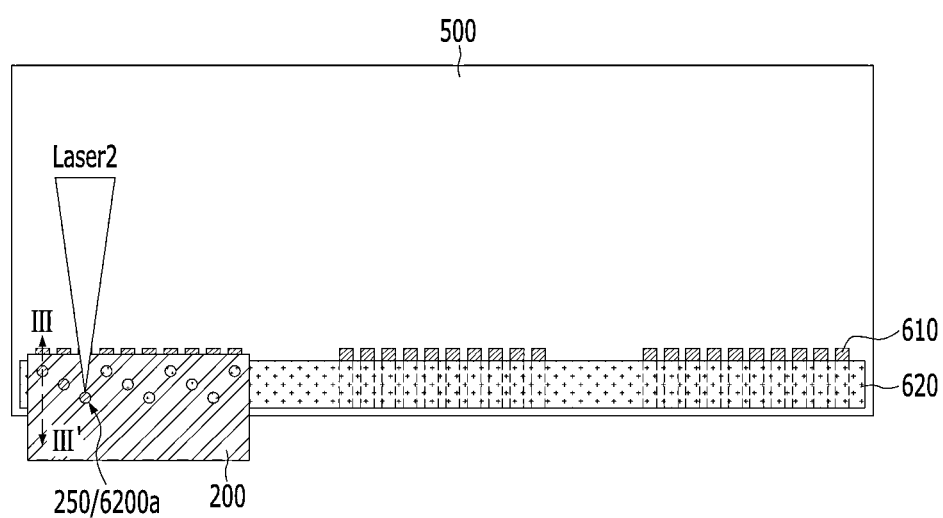
Figure 9C:
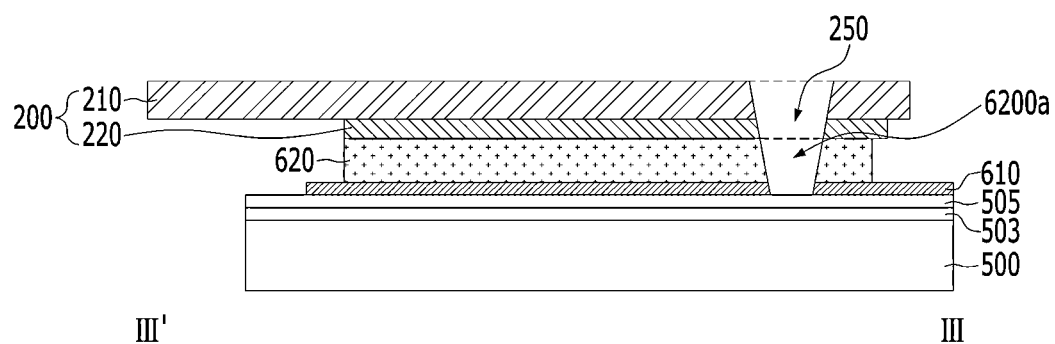

Thereafter, as shown in FIG. 8E, the insulating adhesive holes 6200a can be formed by removing the insulating adhesive 620 from regions corresponding to the circuit film holes 250 by secondarily radiating a laser beam. When the insulating adhesive holes 6200a are formed, the pad electrodes 610 provided under the insulating adhesive 620 can be exposed through the insulating adhesive holes 6200a. When the intensity of the laser beam radiated through secondary layer radiation is increased, the pad electrodes 610 under the insulating adhesive holes 6200a can also be removed, as shown in FIG. 9C. When the pad electrodes 610 around the insulating adhesive holes 6200a are removed, the side parts of the pad electrodes 610 around the insulating adhesive holes 6200a are exposed, and can thus be used in the subsequent bonding process using the solder 350.

Figure 8F:
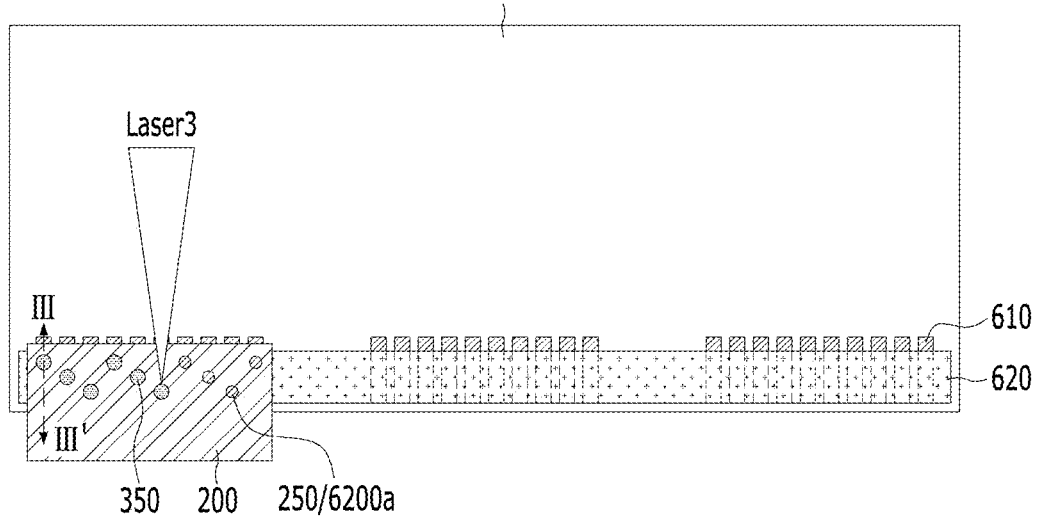
Figure 9D:
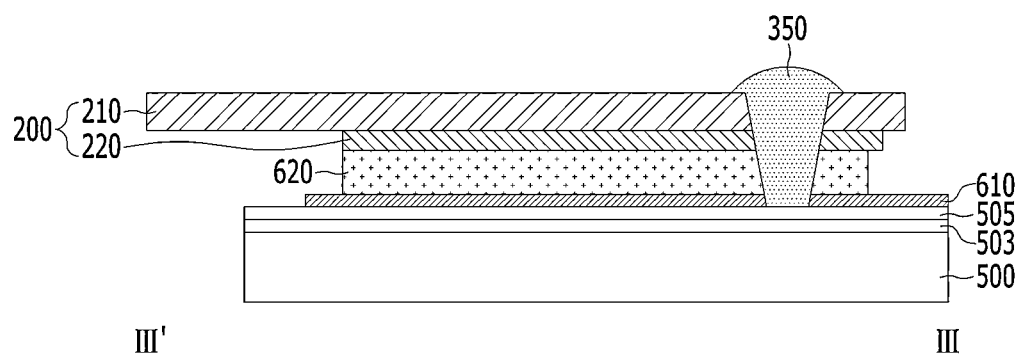

As shown in FIGS. 8F and 9D, the solder 350 is inserted into the circuit film holes 250 formed through the circuit film 200 and the insulating adhesive holes 6200a formed through the insulating adhesive 620 provided under the circuit film 200 by thirdly radiating a laser beam, thereby connecting the connection electrodes 220 and the pad electrodes 610.

Here, the solder 350 is inserted into the circuit film holes 250 formed in the circuit film 250 and the insulating conductive holes 6200a formed in the insulating adhesive 620 provided on the circuit film 250, arranged in each row, and thus connects the connection electrodes 220 to the pad electrodes 610 one-to-one.

FIGS. 10A to 10G are plan views illustrating a process for manufacturing a display device or an electronic device according to a fourth embodiment of the present invention, and FIGS. 11A to 11E are cross-sectional views illustrating the process for manufacturing the display device or the electronic device according to the fourth embodiment of the present invention.

Figure 10A:
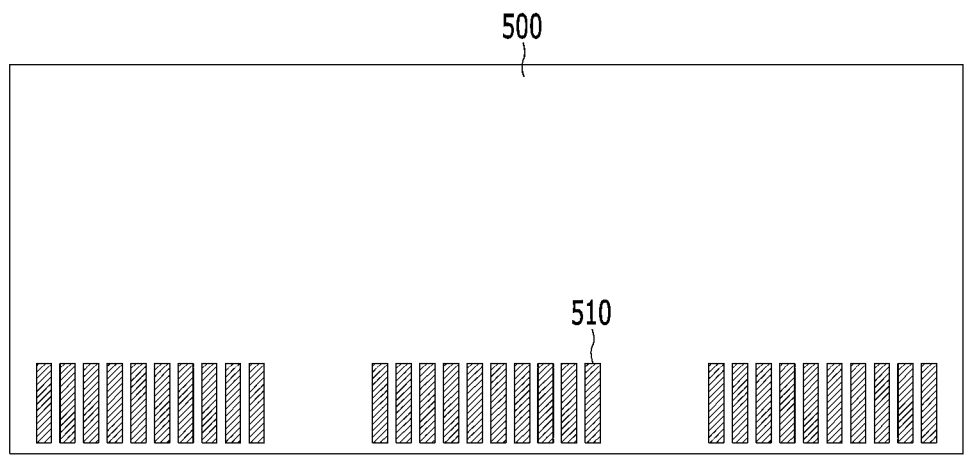
FIGS. 10A to 10G are plan views illustrating a process for manufacturing a display device or an electronic device according to a fourth embodiment of the present invention.

First, as shown in FIG. 10A, a plurality of pad electrodes 510 is prepared on one side of a substrate 500. The pad electrodes 510 are grouped so as to be disposed densely in each of regions corresponding to respective circuit films. Although the shown example illustrates the pad electrodes 510 alone, the pad electrodes 510 have conductive connections to wirings, such as data lines or scan lines, provided in an inner area of the substrate 500. Further, the encapsulation layer 700 (in FIG. 2) is formed on the substrate 500, except for the pad electrodes 510, thereby being capable of protecting the subpixels including the light emitting devices 650 (in FIG. 2) and the thin film transistors formed in the active area AA.

Figure 10B:
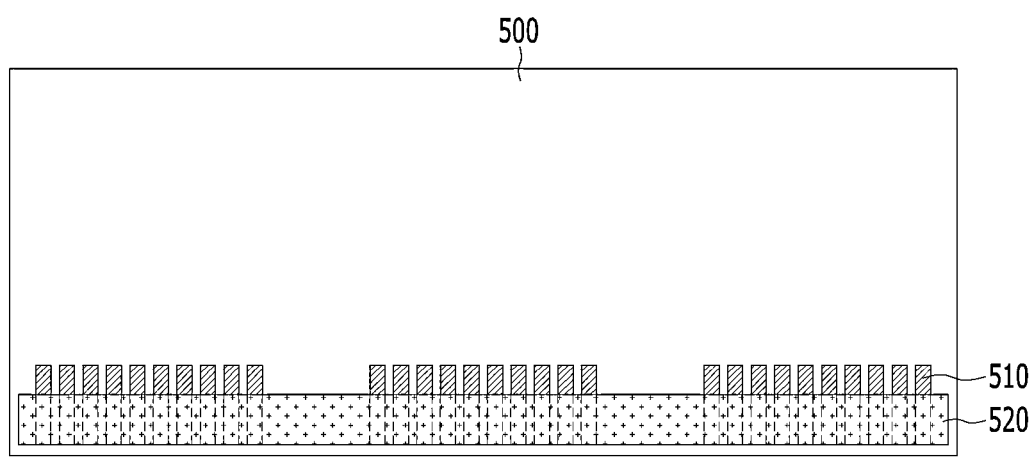

As shown in FIG. 10B, an insulating adhesive 520 is applied in a direction crossing the lengthwise direction of the pad electrodes 510. The insulating adhesive 520 includes at least one of epoxy resins, acrylic resins, or polyurethane resins, and a cross-linker and/or additives.

Figure 10C:
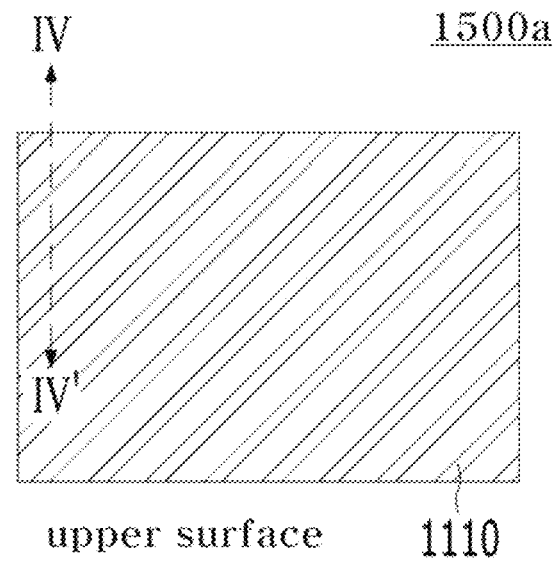
Figure 10C:
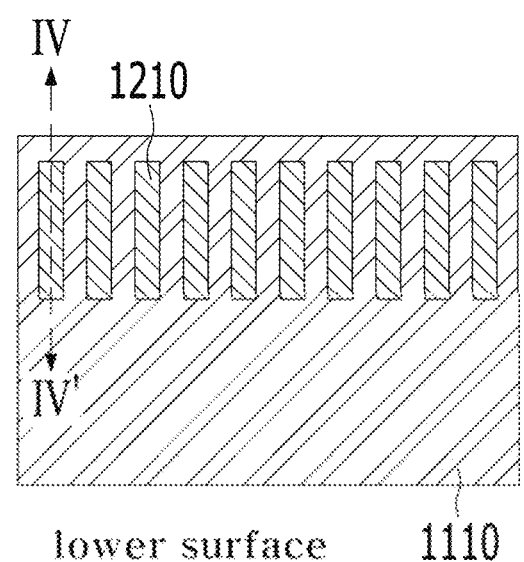
Figure 11A:
FIGS. 11A to 11E are cross-sectional views illustrating the process for manufacturing the display device or the electronic device according to the fourth embodiment of the present invention.

As shown in FIGS. 10C and 11A, a circuit film 1500a includes an insulating film 1100 and a plurality of connection electrodes 1210 provided on the lower surface of the insulating film 1110.

Figure 10D:
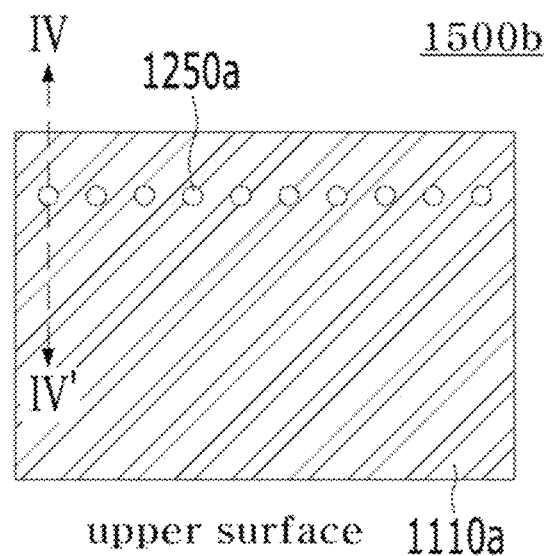
Figure 10D:
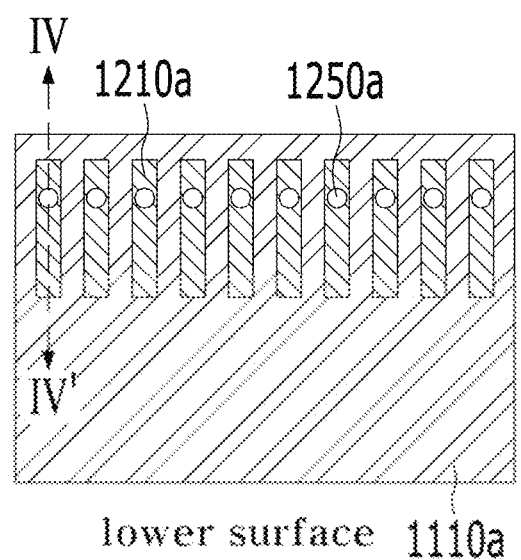
Figure 11B:
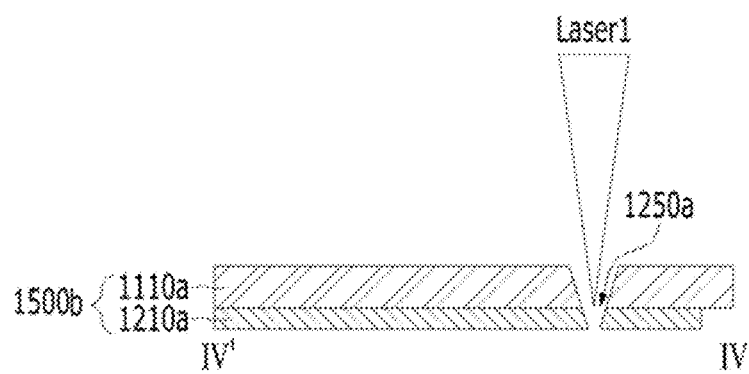

Thereafter, as shown in FIGS. 10D and 11B, a circuit film 1500b having circuit film holes 1250a formed in a row close to the edges of the connection electrodes 1210 is formed by primarily radiating a laser beam onto the circuit film 1500a. The circuit film holes 1250a are vertically coaxially formed through both the insulating film 1110a and the connection electrodes 1210a, and are thus observed on both the upper and lower surfaces of the circuit film 1500b.

Figure 10E:
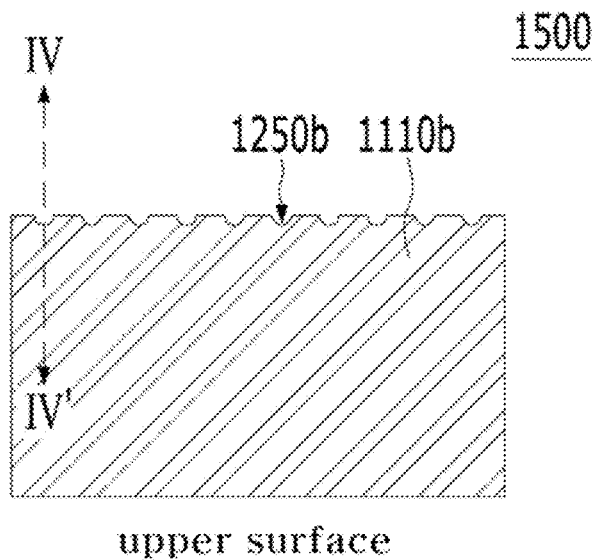
Figure 10E:
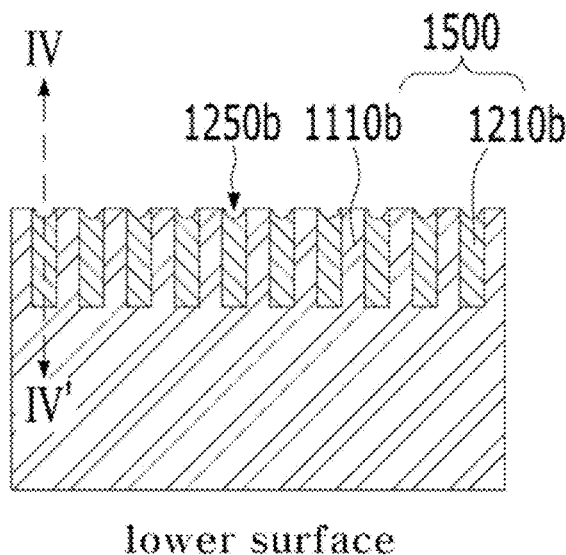
Figure 11C:
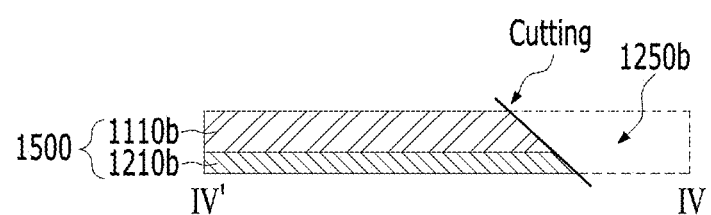

Thereafter, as show in FIGS. 10E and 11C, the circuit film 1500b is cut in one direction so that only a part of each of the circuit film holes 1250a remains (although the shown example illustrates that the remaining part has a semicircular shape, the remaining part is not limited thereto). After cutting is completed, one open edge of each of the respective connection electrodes 1210b has a semicircular shape. Here, as shown in FIG. 11C, the side part of the circuit film 1500 has an inclined part, and a part of the circuit film 1500 located outside the connection electrodes 1210b is removed, and thereby, the side parts of the connection electrodes 1210b can be more exposed, compared to the insulating film 1110b.

Because the part 1250b of the circuit film 1500 remaining after the process of FIGS. 10E and 11C is not located inside the circuit film 1500 but is exposed to the outside, this part 1250b is referred to as a removal part rather than holes. The removal part 1250b can have a semicircular shape but is not limited thereto. For example, the removal part 1250b can have an arc shape or one of various polygonal shapes.

Figure 10F:
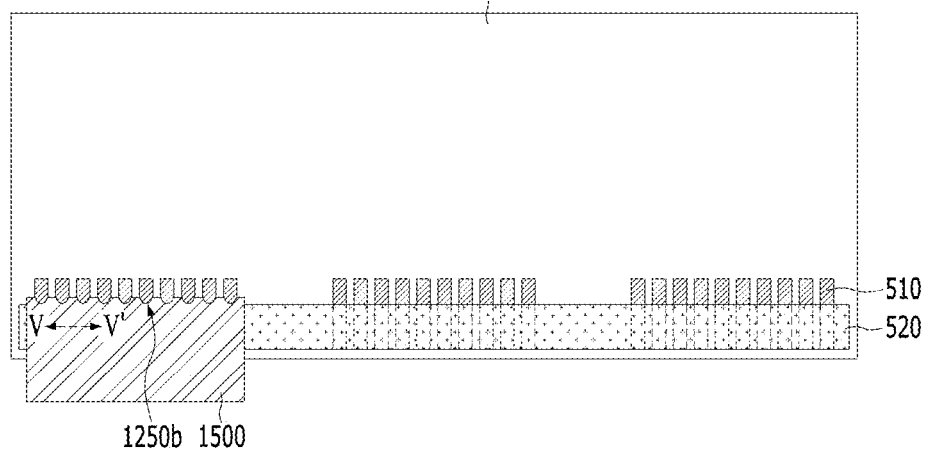

The circuit film 1500 having the removal part 1250b is disposed on the substrate 500 to which the insulating adhesive 520 is applied, as shown in FIG. 10F. When the circuit film 1500 is aligned with the upper surface of the substrate 500, a part of each of the pad electrodes 510 is exposed from the circuit film 1500, and thereby, alignment between the pad electrodes 510 and the respective connection electrodes 1210b of the circuit film 1500 can be easily performed. Here, as shown in FIG. 10F, the pad electrodes 510 are observed outside the removal part 1250b of the circuit film 1500.

Figure 10G:
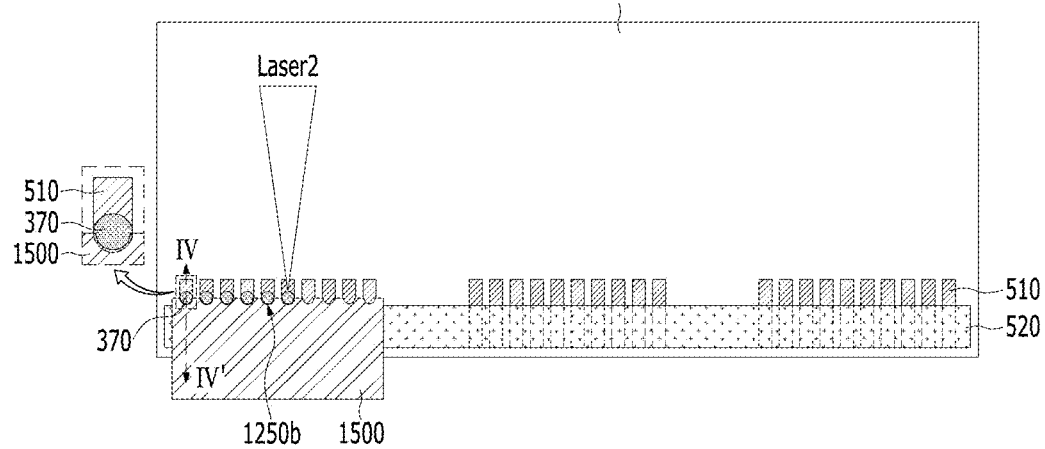
Figure 11D:
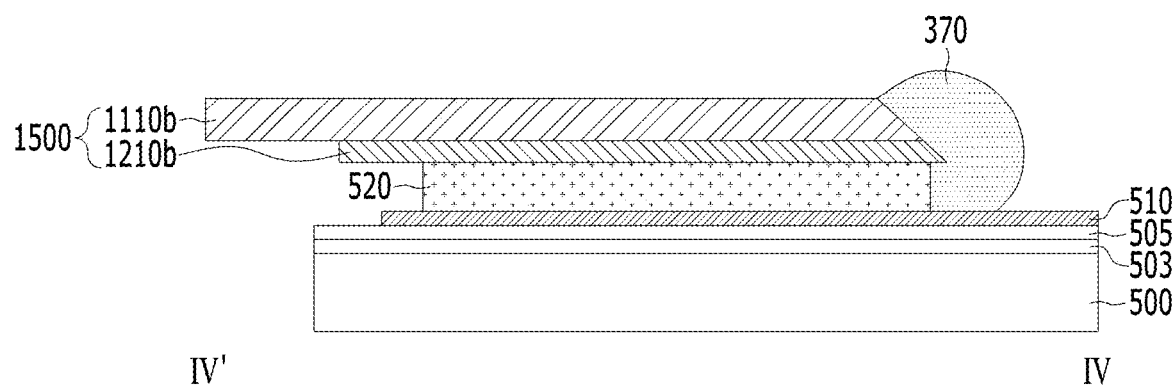

As shown in FIGS. 10G and 11D, the solder 370 is applied to the removal part 1250b while secondarily radiating a laser beam onto the removal part 1250b (i.e., by laser scanning). Here, the respective pad electrodes 510 can be connected to the corresponding connections 1210b by the solder 370 by secondarily radiating the laser onto the edge of the circuit film 1500 having the removal part 1250b.

Figure 11E:
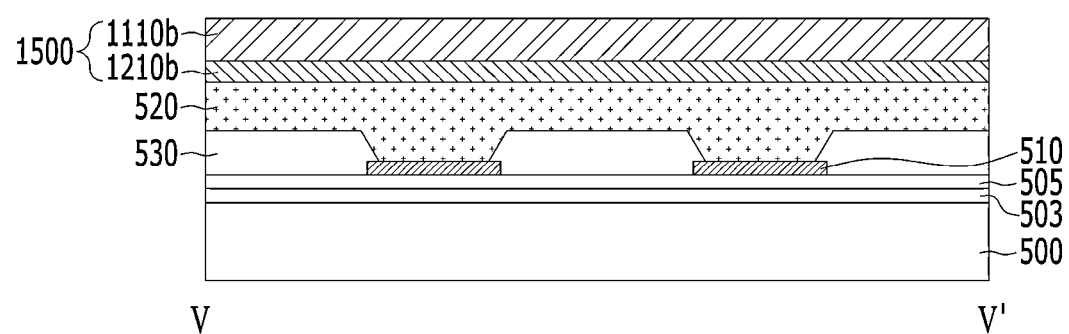

As shown in FIG. 11E, a protective film 530 configured to cover spaces between the pad electrodes 510 and the edges of the pad electrodes 510 can be further formed in a direction crossing adjacent pad electrodes 510, and regions in which the solder 370 is not provided are filled with the insulating adhesive 520 configured to cover the protective film 530 and the pad electrodes 510, thereby adhering the circuit film 1500 to the substrate 500.

FIGS. 12A to 12E are plan views illustrating a process for manufacturing a display device according to a modified example of the second embodiment of the present invention, and FIGS. 13A to 13D are cross-sectional views illustrating the process for manufacturing the display device according to the modified example of the second embodiment of the present invention.

A method for manufacturing the display device according to the modified example of the second embodiment of the present invention is executed in the order given below.

Figure 12A:
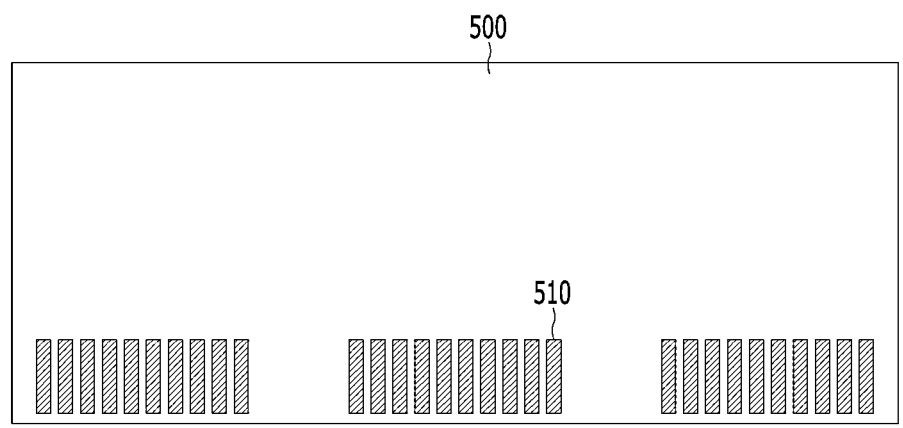
FIGS. 12A to 12E are plan views illustrating a process for manufacturing a display device or an electronic device according to a modified example of the second embodiment of the present invention.

First, as shown in FIG. 12A, a plurality of pad electrodes 510 is prepared on one side of a substrate 500. The pad electrodes 510 are grouped so as to be disposed densely in each of regions corresponding to respective circuit films. Although the shown example illustrates the pad electrodes 510 alone, the pad electrodes 510 have conductive connection to wirings, such as data lines or scan lines, provided in an inner area of the substrate 500. Further, the encapsulation layer 700 (in FIG. 2) is formed on the substrate 500, except for the pad electrodes 510, thereby being capable of protecting the subpixels including the light emitting devices 650 (in FIG. 2) and the thin film transistors formed in the active area AA.

Figure 12B:
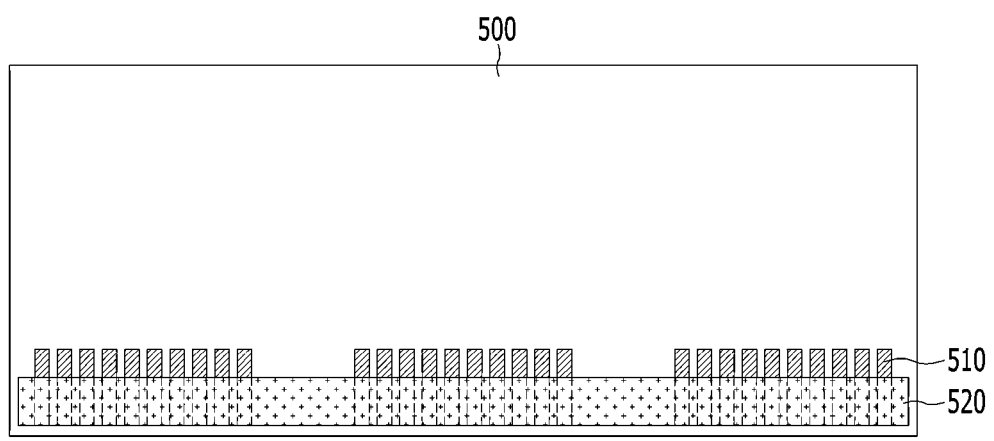

As shown in FIG. 12B, an insulating adhesive 520 is applied in a direction crossing the lengthwise direction of the pad electrodes 510. The insulating adhesive 520 includes at least one of epoxy resins, acrylic resins, or polyurethane resins, and a cross-linker and/or additives.

Figure 12C:
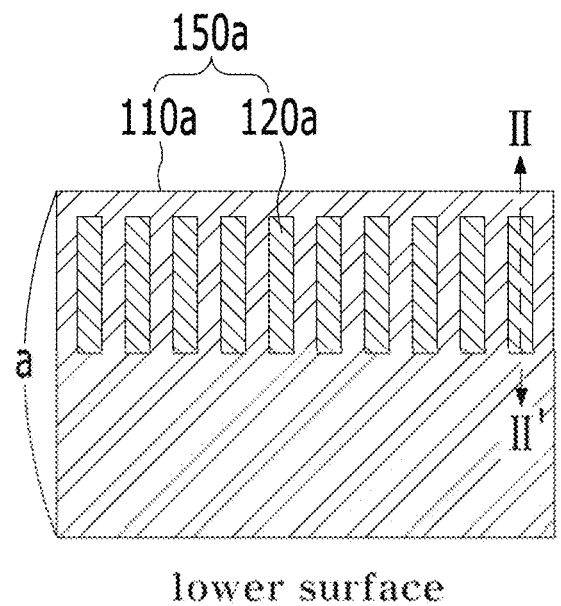
Figure 12C:
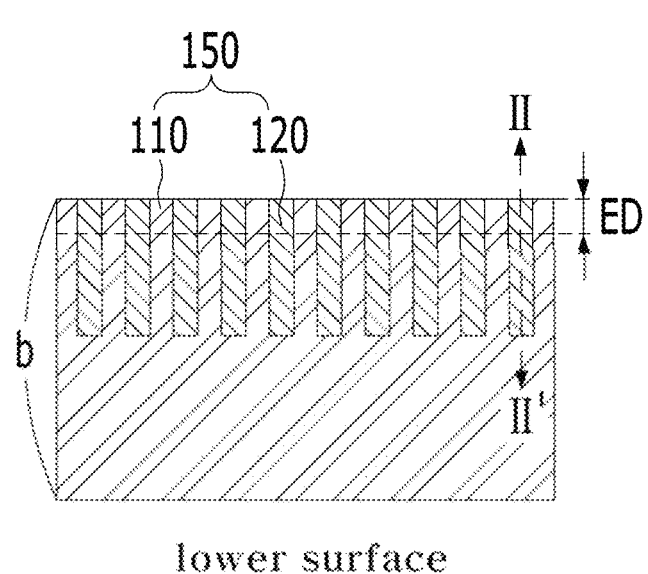
Figure 13A:
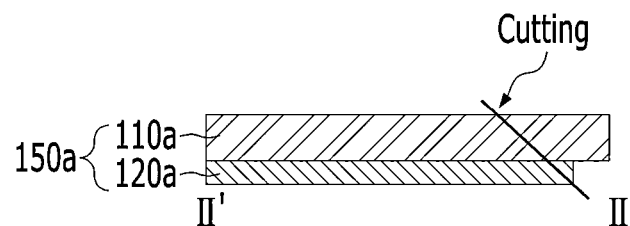
FIGS. 13A to 13D are cross-sectional views illustrating the process for manufacturing the display device or the electronic device according to the modified example of the second embodiment of the present invention.

As shown in FIGS. 12C and 13A, circuit films 150a, each of which includes a plurality of connection electrodes 120a provided on the lower surface of an insulating film 110a, are prepared. The connection electrodes 120a are arranged at a pitch corresponding to the pitch between the pad electrodes 510 on the substrate 500. The edge of one side of the outermost connection electrode 120a is spaced apart from the edge of the circuit film 150a.

Figure 13B:
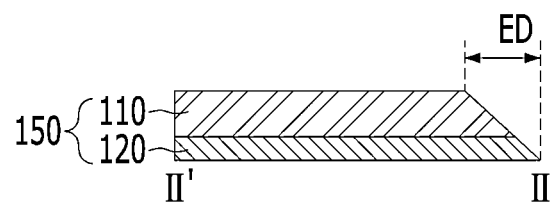

Thereafter, as shown in FIG. 13B, an inclined part ED which is inclined to the lower surface of the circuit film 150 is prepared by cutting the edge of the circuit film 150 so as to expose the side parts of the connection electrodes 120. Here, the inclined part ED is formed on both the insulating film 110 and the connection electrodes 120.

Figure 12D:
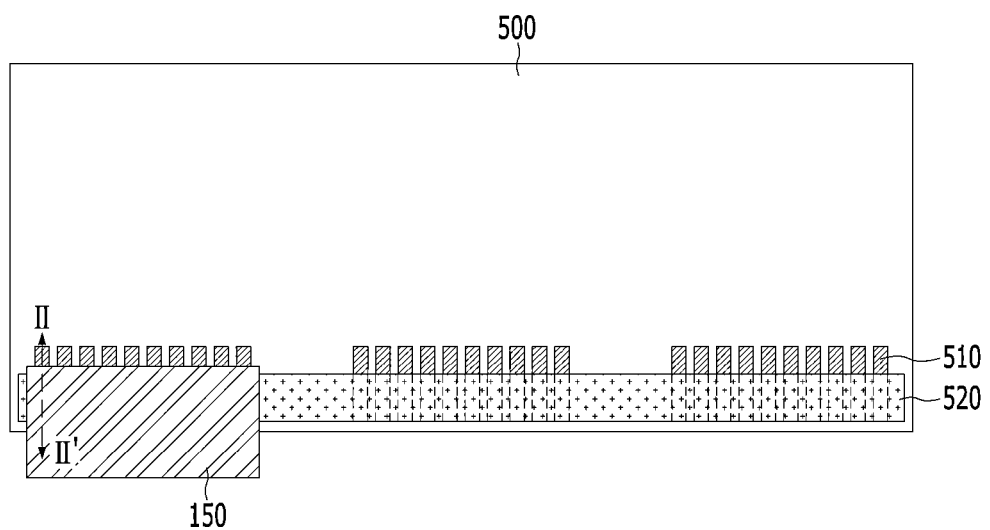
Figure 13C:
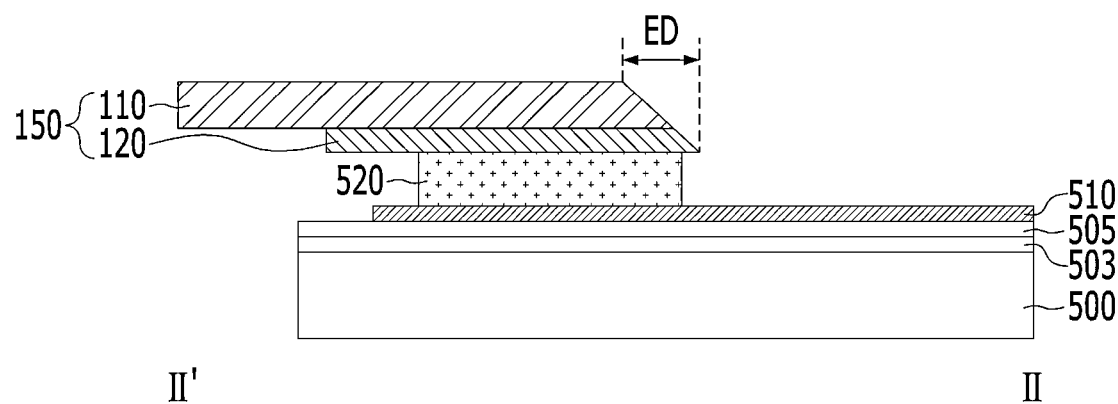

Thereafter, as shown in FIGS. 12D and 13C, the circuit film 150, in which the side parts of the connection electrodes 120 are exposed through the inclined part ED, is disposed on the region in which the pad electrodes 510 are disposed densely on the substrate 500. During such a process, the connection electrodes 120 of the circuit film 150 are adhered to the pad electrodes 510 in the region in which the insulating adhesive 520 is applied. Here, one side of each of the pad electrodes 510 is exposed from the circuit film 150.

For reference, inorganic insulating films, such as a buffer layer 503 and an interlayer insulating film 505, can be interposed between the substrate 500 and the pad electrodes 510.

Figure 12E:
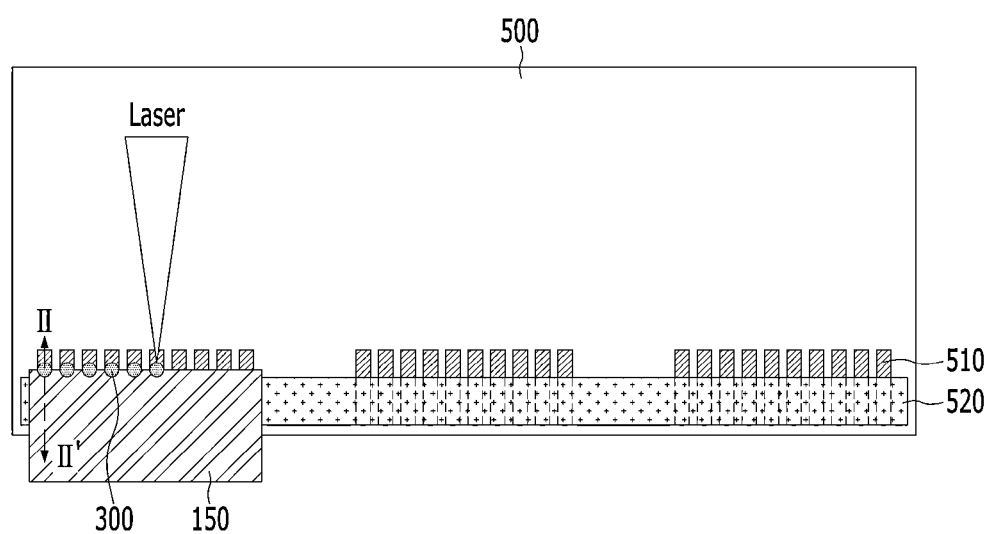
Figure 13D:
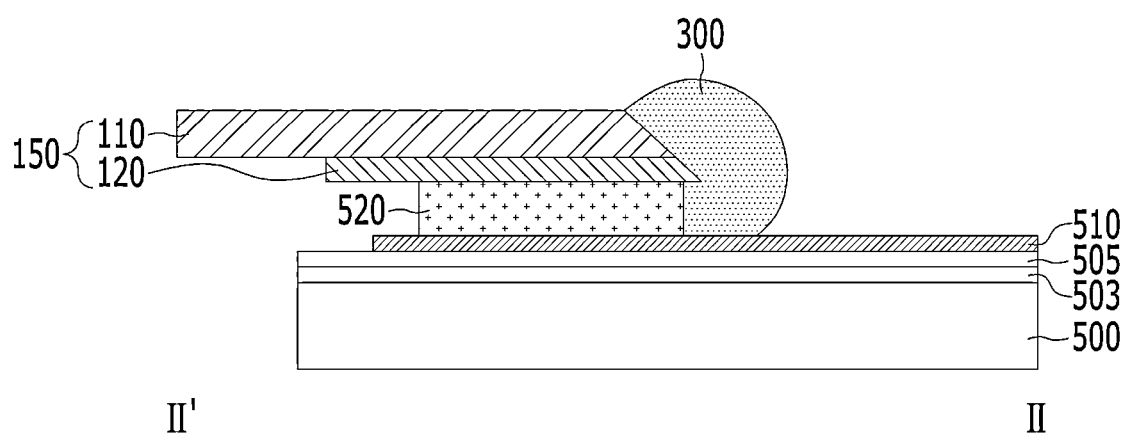

As shown in FIGS. 12E and 13D, solder 300 is applied so as to connect the exposed side parts of the connection electrodes 120 at the inclined part ED of the circuit film 150 to the corresponding pad electrodes 510 by laser scanning on the respective pad electrodes 510. Here a laser beam is radiated so as to enable the solder 300 having wettability to flow down along the inclined part ED due to capillary action. When the solder 300 is applied using a laser beam, a metal forming the solder 300 is instantaneously hardened at a temperature higher than or equal to the melting point thereof by energy applied due to the laser beam, and thus, the solder 300 is fixed to the side parts of the respective connection electrodes 120 and the upper surfaces of the corresponding pad electrodes 510. Here, the solder 300 meets the side part of the insulating adhesive 520 between the connection electrodes 120 and the pad electrodes 510. The insulating adhesive 520 fills spaces between the pad electrodes 510 and the connection electrodes 120, to which the solder 300 is not applied, and spaces between the respective pad electrodes 510, provided between the substrate 500 and the circuit film 150, thereby being capable of adhering the circuit film 150 to the substrate 500.

In an electronic device and a display device using the same according to the present invention, regions to which a solder is applied are provided through a removal part or holes formed on or in a circuit film so as to respectively connect connection electrodes to corresponding pad electrodes, thereby being capable of omitting the thermoscompression process used in the conventional method using an anisotropic conductive film (ACF). Particularly, occurrence of a short-circuit or a failure in bonding, caused by agglomeration of conductive balls or flow of the conductive balls during the thermos-compression process, can be prevented or minimized.

For this purpose, an electronic device according to one embodiment the present invention can include an electronic device including a plurality of pad electrodes provided at at least one side of a substrate, at least one circuit film configured to have a plurality of connection electrodes provided at an insulating film to correspond to the pad electrodes, a plurality of solders to conductively connect the connection electrodes to the pad electrodes exposed from the circuit film one-to-one, and an insulating adhesive configured to fill spaces between the pad electrodes and the connection electrodes, which do not come into contact with the solder, between the substrate and the circuit film.

The thickness of the solders can be equal to or greater than the sum of the thickness of the circuit film and the thickness of the insulating adhesive.

Each of the solders can be connected to a side part of one of the connection electrodes and a side part of the insulating adhesive.

The insulating film can have an inclined edge for each of the connection electrodes such that each of the solders is applied thereto.

Each of the connection electrodes can have a cutting part inclined at an angle to extend from the inclined edge of the insulating film.

The insulating film and the connection electrodes can respectively have coaxial circuit film holes filled with the solders, and the insulating adhesive can have insulating adhesive holes continuous to the circuit film holes.

The pad electrodes can have pad electrode holes continuous to the insulating adhesive holes, and the each of solders can be connected to at least one the pad electrode through an inner surface of at least one pad electrode hole.

The circuit film holes can be provided in a plurality of rows in the insulating film, the circuit film holes in one row can be arranged every n connection electrodes (n being a natural number equal to or greater than 2), and the circuit film holes in adjacent rows can be located in different columns.

The electronic device can further include at least one inorganic insulating film provided between the substrate and the pad electrodes, and an organic insulating film provided between the pad electrodes to cover edges of the pad electrodes and to have a thickness equal to or greater than a thickness of the pad electrodes.

A display device according to one embodiment the present invention can include a plurality of pad electrodes provided at at least one side of a display panel to be connected to at least one wiring provided in the display panel, at least one circuit film to have a plurality of connection electrodes provided at an insulating film so as to correspond to the pad electrodes, a plurality of solders to conductively connect the connection electrodes to parts of the pad electrodes exposed from the circuit film one-to-one, and an insulating adhesive to fill spaces between the pad electrodes and the connection electrodes, which do not come into contact with the solder, between the substrate and the circuit film.

The circuit film can have a removal part, formed by removing the insulating film and the connection electrodes, to expose a designated part of each of the connection electrodes.

The thickness of the solders can be equal to or greater than the sum of the thickness of the circuit film and the thickness of the insulating adhesive.

Each of the solders can be applied to the removal part to be connected a side part of one of the pad electrodes and a side part of the insulating adhesive.

The removal part can be provided at the edge of the circuit film.

The removal part can have coaxial circuit film holes respectively formed through the insulating film and the connection electrodes to be filled with the solder, and the insulating adhesive can have insulating adhesive holes continuous to the circuit film holes.

The pad electrodes can have pad electrode holes continuous to the insulating adhesive holes, and each of the solders can be connected to at least one pad electrodes through an inner surface of at least one pad electrode holes.

As is apparent from the above description, an electronic device and a display device using the same according to one or more embodiments of the present invention have the following effects and advantages.

First, the edge of a circuit film is changed or holes are formed in the circuit film, each of the side parts of connection electrodes provided on the circuit film can be connected to a part of the upper surface or the side part of a corresponding one of pad electrodes on a substrate, which are exposed from the edge of the circuit film or the circuit film holes, by inserting solder into the edge of the circuit film or the circuit film holes. When heat of the melting point of a metal component of the solder is instantaneously applied while the solder is inserted into the edge of the circuit film or the circuit film holes, the solder contacts the side parts of the pad electrodes and the connection electrodes and is then hardened almost simultaneously with insertion of the solder, and thereby, the pad electrodes and the connection electrodes are connected. Therefore, the thermos-compression process for connection between the circuit film and the substrate can be omitted, and misalignment of a conductive medium and occurrence of a short-circuit between adjacent pad electrodes caused by the thermos-compression process can be prevented effectively.

Second, a region into which the solder is inserted can be provided in advance as a hole or a removal part of the circuit film, and the hole or the removal part can be provided in the respective connection electrodes. Therefore, the connection electrodes having the holes or the removal part can be connected to the corresponding pad electrodes one-to-one, and a short-circuit between adjacent pad electrodes or a connection failure due to flow of the conductive medium can be prevented.

Third, because formation of the circuit film holes (or the removal part) corresponding to the connection electrodes and the pad electrodes and supply of the solder can be easily performed by laser scanning in which a region is set to a fine spot, this structure can be coped with a pad part having a fine pitch, and can thus be applied a high-resolution device. Particularly, when not only a pad part for drivers but also drivers for touchscreens are provided on a substrate, such as a display panel, even though the pitch between the pad electrodes is more narrowed, the holes or the removal part can be set to a fine spot size, and thus the circuit film and the substrate can be connected without a failure.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:
1. An electronic device comprising:
a plurality of pad electrodes provided at at least one side of a substrate;
at least one circuit film including an insulating film and a plurality of connection electrodes on the insulating film, the plurality of connection electrodes to face the plurality of pad electrodes;
a plurality of solders to conductively connect the plurality of connection electrodes to the plurality of pad electrodes exposed from the circuit film one-to-one; and
an insulating adhesive to fill spaces between the plurality of pad electrodes and the plurality of connection electrodes,
wherein each of the plurality of solders has an edge horizontally protruding from an edge of the insulating film, and wherein the edge of each of the plurality of solders is in contact with the edge of the insulating film of the at least one circuit film.

2. The electronic device according to claim 1, wherein the edge of the insulating film has an inclined edge for each of the plurality of connection electrodes.

3. The electronic device according to claim 2, wherein each of the plurality of solders is applied to the inclined edge of the insulating film.

4. The electronic device according to claim 1, wherein each of the plurality of solders is connected to a side part of one of the plurality of connection electrodes and a side part of the insulating adhesive.

5. The electronic device according to claim 2, wherein each of the plurality of connection electrodes has a cutting part inclined at an angle to extend from the inclined edge of the insulating film.

6. The electronic device according to claim 1, wherein the insulating film and the plurality of the connection electrodes in the at least one circuit film respectively have coaxial circuit film openings filled with the plurality of solders.

7. The electronic device according to claim 1, wherein a thickness of one solder among the plurality of solders is equal to or greater than a sum of a thickness of one circuit film among the at least one circuit film and a thickness of the insulating adhesive.

8. The electronic device according to claim 1, wherein the plurality of the pad electrodes are horizontally protruding from the plurality of solders.

9. The electronic device according to claim 1, further comprising:
at least one inorganic insulating film provided between the substrate and the plurality of pad electrodes; and
an organic insulating film provided between the pad electrodes to cover edges of the plurality of pad electrodes and to have a thickness equal to or greater than a thickness of one pad electrode among the plurality of pad electrodes.

10. The electronic device according to claim 1, wherein a lower surface of the insulating adhesive is in contact with the pad electrodes, an upper surface of the insulating adhesive is in contact with the connection electrodes, and at least one lateral surface of the insulating adhesive is in contact with the at least one of the plurality of solders.

11. A display device comprising:
a plurality of pad electrodes provided at at least one side of a display panel to be connected to at least one wiring provided in the display panel;
at least one circuit film including an insulating film and a plurality of connection electrodes on the insulating film, the plurality of connection electrodes to face the plurality of pad electrodes;
a plurality of solders to conductively connect the connection electrodes to the plurality of pad electrodes exposed from the circuit film one-to-one; and
an insulating adhesive to fill spaces between the plurality of pad electrodes and the plurality of connection electrodes,
wherein each of the plurality of solders has an edge horizontally protruding from an edge of the insulating film, and
wherein the edge of each of the plurality of solders is in contact with the edge of the insulating film of the at least one circuit film.

12. The display device according to claim 11, wherein the edge of the insulating film has an inclined edge for each of the plurality of connection electrodes.

13. The display device according to claim 12, wherein each of the plurality of solders is applied to the inclined edge of the insulating film.

14. The display device according to claim 11, wherein the edge of the circuit film has an inclined edge to expose a designated part of each of the connection electrodes,
each of the plurality of connection electrodes has a cutting part inclined at an angle to extend from the inclined edge of the insulating film.

15. The display device according to claim 11, wherein a thickness of one solder among the plurality of solders is equal to or greater than a sum of a thickness of one circuit film among the at least one circuit film and a thickness of the insulating adhesive.

16. The display device according to claim 11, wherein each of the plurality of solders is connected a side part of one of the plurality of pad electrodes and a side part of the insulating adhesive.

17. The display device according to claim 11, wherein the insulating film and the plurality of the connection electrodes in the at least one circuit film respectively have coaxial circuit film openings filled with the plurality of solders.

18. The display device according to claim 11, wherein the plurality of the pad electrodes are horizontally protruding from the plurality of solders.

19. The electronic device according to claim 11, further comprising:
at least one inorganic insulating film provided between the substrate and the plurality of pad electrodes; and
an organic insulating film provided between the pad electrodes to cover edges of the plurality of pad electrodes and to have a thickness equal to or greater than a thickness of one pad electrode among the plurality of pad electrodes.

20. The display device according to claim 11, wherein a lower surface of the insulating adhesive is in contact with the pad electrodes, an upper surface of the insulating adhesive is in contact with the connection electrodes, and at least one lateral surface of the insulating adhesive is in contact with the at least one of the plurality of solders.

* * * * *